US011626321B2

(12) United States Patent
Godet et al.

(10) Patent No.: US 11,626,321 B2
(45) Date of Patent: Apr. 11, 2023

(54) MULTI STACK OPTICAL ELEMENTS USING TEMPORARY AND PERMANENT BONDING

(71) Applicant: Applied Materials, Inc., Santa Clara, CA (US)

(72) Inventors: Ludovic Godet, Sunnyvale, CA (US); Wayne McMillan, San Jose, CA (US); Rutger Meyer Timmerman Thijssen, Santa Clara, CA (US); Naamah Argaman, San Jose, CA (US); Tapashree Roy, Bangalore (IN); Sage Toko Garrett Doshay, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 66 days.

(21) Appl. No.: 16/882,177

(22) Filed: May 22, 2020

(65) Prior Publication Data

US 2020/0286778 A1 Sep. 10, 2020

Related U.S. Application Data

(63) Continuation of application No. 16/283,560, filed on Feb. 22, 2019, now Pat. No. 10,707,118.

(Continued)

(51) Int. Cl.
*H01L 21/768* (2006.01)
*H01L 21/3213* (2006.01)
(Continued)

(52) U.S. Cl.
CPC ...... *H01L 21/76816* (2013.01); *H01L 21/311* (2013.01); *H01L 21/32134* (2013.01); *H01L 25/043* (2013.01); *H01L 25/167* (2013.01)

(58) Field of Classification Search
CPC ......... H01L 21/67253; H01L 21/67259; H01L 21/67201; H01L 21/67288; H01L 22/12;
(Continued)

(56) References Cited

U.S. PATENT DOCUMENTS

| 6,256,437 B1 | 7/2001 | Sakushima et al. |
| 6,411,765 B1 | 6/2002 | Ono |

(Continued)

FOREIGN PATENT DOCUMENTS

| CN | 1165994 C | 9/2004 |
| EP | 2733752 B1 | 10/2016 |

(Continued)

OTHER PUBLICATIONS

Japanese Patent Application No. 2020-556237, Office Action dated Jan. 18, 2022, 12 pages.

(Continued)

*Primary Examiner* — Meiya Li
(74) *Attorney, Agent, or Firm* — Patterson & Sheridan, LLP

(57) ABSTRACT

Systems and methods herein are related to the formation of optical devices including stacked optical element layers using silicon wafers, glass, or devices as substrates. The optical elements discussed herein can be fabricated on temporary or permanent substrates. In some examples, the optical devices are fabricated to include transparent substrates or devices including charge-coupled devices (CCD), or complementary metal-oxide semiconductor (CMOS) image sensors, light-emitting diodes (LED), a micro-LED (uLED) display, organic light-emitting diode (OLED) or vertical-cavity surface-emitting laser (VCSELs). The optical elements can have interlayers formed in between optical element layers, where the interlayers can range in thickness from 1 nm to 3 mm.

10 Claims, 19 Drawing Sheets

Related U.S. Application Data

(60) Provisional application No. 62/780,536, filed on Dec. 17, 2018, provisional application No. 62/658,553, filed on Apr. 16, 2018.

(51) Int. Cl.
  *H01L 21/311* (2006.01)
  *H01L 25/04* (2023.01)
  *H01L 25/16* (2023.01)

(58) Field of Classification Search
  CPC ......... H01L 21/67167; H01L 21/67196; H01L 21/67236; H01L 21/67242; H01L 21/67248; H01L 21/67748; H01L 21/681; H01L 22/26; H01L 21/3065; H01L 21/3086; H01L 21/3088; H01L 21/31116; H01L 21/31138; H01L 21/67017; H01L 21/67028; H01L 21/6831; H01L 21/68742; H01L 22/20; H01L 29/127; H01L 31/0392; H01L 31/046; H01L 31/0463; H01L 31/18
  See application file for complete search history.

(56) References Cited

U.S. PATENT DOCUMENTS

| | | | |
|---|---|---|---|
| 9,537,098 | B2 | 1/2017 | Lee et al. |
| 10,429,581 | B1* | 10/2019 | Thomas .................. G02B 6/13 |
| 2004/0201026 | A1 | 10/2004 | Gill et al. |
| 2005/0275944 | A1 | 12/2005 | Wang et al. |
| 2007/0165308 | A1* | 7/2007 | Wang .................. G02B 5/3083 359/487.03 |
| 2009/0315131 | A1* | 12/2009 | Hung ................ H01L 27/14632 257/E31.127 |
| 2010/0220377 | A1* | 9/2010 | Yamada .............. H01L 27/1462 359/241 |
| 2011/0284975 | A1 | 11/2011 | Braeuer et al. |
| 2013/0143414 | A1 | 6/2013 | Thomas et al. |
| 2015/0069523 | A1 | 3/2015 | Or-Bach et al. |
| 2018/0126381 | A1* | 5/2018 | Huff .................. B01L 3/502784 |
| 2019/0033683 | A1* | 1/2019 | Ahmed .................. C23C 16/24 |

FOREIGN PATENT DOCUMENTS

| | | |
|---|---|---|
| JP | 2010008990 A | 1/2010 |
| JP | 2010009025 A | 1/2010 |
| JP | 2011002546 A | 1/2011 |
| JP | 2015022109 A | 2/2015 |
| JP | 2015031856 A | 2/2015 |
| JP | 2015087526 A | 5/2015 |
| KR | 20140073622 A | 6/2014 |
| KR | 1020140073622 A | 6/2014 |
| TW | I243288 B | 11/2005 |
| TW | 201033751 A | 9/2010 |
| TW | I546859 B | 8/2016 |
| TW | I579897 B | 4/2017 |
| TW | I583534 B | 5/2017 |
| TW | 201726345 A | 8/2017 |
| WO | 2012060274 A1 | 5/2012 |
| WO | 2012077738 A1 | 6/2012 |

OTHER PUBLICATIONS

European Patent Application No. 19787886.1, Supplementary Partial European Search Report dated Dec. 10, 2021, 13 pages.
PCT/US2019/018885, International Search Report dated Jun. 3, 2019, 7 pages.
Taiwan Patent Application No. 108106624, Official Letter dated Feb. 7, 2020, 13 pages.
Taiwan Office Action dated May 6, 2021, for Taiwan Patent Application No. 109133583.
Japanese Patent Application No. 2020-556237, Final Office Action dated Aug. 2, 2022, 6 pages.

* cited by examiner

MULTI STACK OPTICAL ELEMENTS USING TEMPORARY AND PERMANENT BONDING

CROSS-REFERENCE TO RELATED APPLICATIONS

This application is a continuation of U.S. Ser. No. 16/283,560, filed Feb. 22, 2019, which claims priority to U.S. Provisional Patent Application 62/658,553, filed Apr. 16, 2018 and U.S. Provisional Patent Application 62/780,536, filed Dec. 17, 2018, incorporated by reference in their entirety.

BACKGROUND

Field

The embodiments of the disclosure generally relate to optical devices and systems and methods of fabricating optical element devices.

Description of the Related Art

Novel optical devices, including metasurfaces can be patterned on one or both sides of transparent substrates and enable many optical device possibilities. However, a minimum thickness of a glass substrate is required for traditional processing techniques including optical lithography, and, for most optical devices of interest these thickness limitations are not commercially viable. The substrate minimum thickness limits processing options for later thinning the substrate when fabricating optical devices with elements present on both the front and the back surfaces of a substrate.

There are many concerns to address in the fabrication of novel optical devices on glass substrates, including metallic contamination from the substrate to the lithography tool chuck, handling breakage, glass transparency, metrology performance in the lithography tool, as well as other factors. For various optical applications, multiple layers of optical elements are used in an optical device to correct aberrations. Using multiple optical element layers may include patterning on the backside of a glass substrate to make a doublet. Bonding this doublet to another glass substrate to make a triplet and so on may be performed. These are challenging processes to do cost effectively and without damage to the nano-scale features.

Further challenges in optical device fabrication include the fabrication of buffer layers of thicknesses up to several millimeters in between optical elements. Conventional methods of optical element and structure fabrication can face fabrication issues including pattern alignment that can make fabrication of these double-sided optical elements challenging.

Thus, there remains a need for systems and methods of improved optics and methods of manufacturing improved optics.

SUMMARY

Embodiments of the present disclosure are generally directed towards optical devices that include optical element layers, and methods of forming the optical devices. In one example, a method of forming an optical device includes: (a) forming a pattern in a target layer on a first substrate, wherein the pattern includes a plurality of islands separated by a plurality of trenches; and (b) forming a low-refractive index material on top of the patterned target layer and in the plurality of trenches formed in the patterned target layer to form a first optical device. The method can further include (c) forming a stack of optical element layers on the first optical device by repeating (a) and (b) for a plurality of iterations.

In another example, a method of fabricating optical elements, includes forming a first pattern in a first target layer formed on a first substrate and forming a second pattern in a second target layer formed on a second substrate. The first pattern is then bonded to a first side of a third substrate formed from a transparent material and being from about 10 µm thick to 3 mm thick. The method further includes bonding the second pattern to a second side of the third substrate; de-bonding the first substrate from the first pattern; and de-bonding the second substrate from the second pattern.

In another example, a method of forming an optical element, includes: forming a first pattern by imprinting a first target layer in a first location using a first pattern master, the first target layer being formed on a first side of a transparent substrate, wherein the transparent substrate is from about 10 µm thick to about 3 mm thick. The method further includes forming a second pattern by imprinting a second pattern in a second location on a second target layer formed on a second side of the transparent substrate using a second pattern master. Forming the second pattern in the second location includes determining the second location relative to the first pattern and aligning the second pattern master in the second location.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Identical reference numerals have been used, where possible, to designate identical elements that are common to the figures. It is contemplated that elements disclosed in one implementation may be beneficially utilized in other implementations without specific recitation.

DETAILED DESCRIPTION

Figure 1:
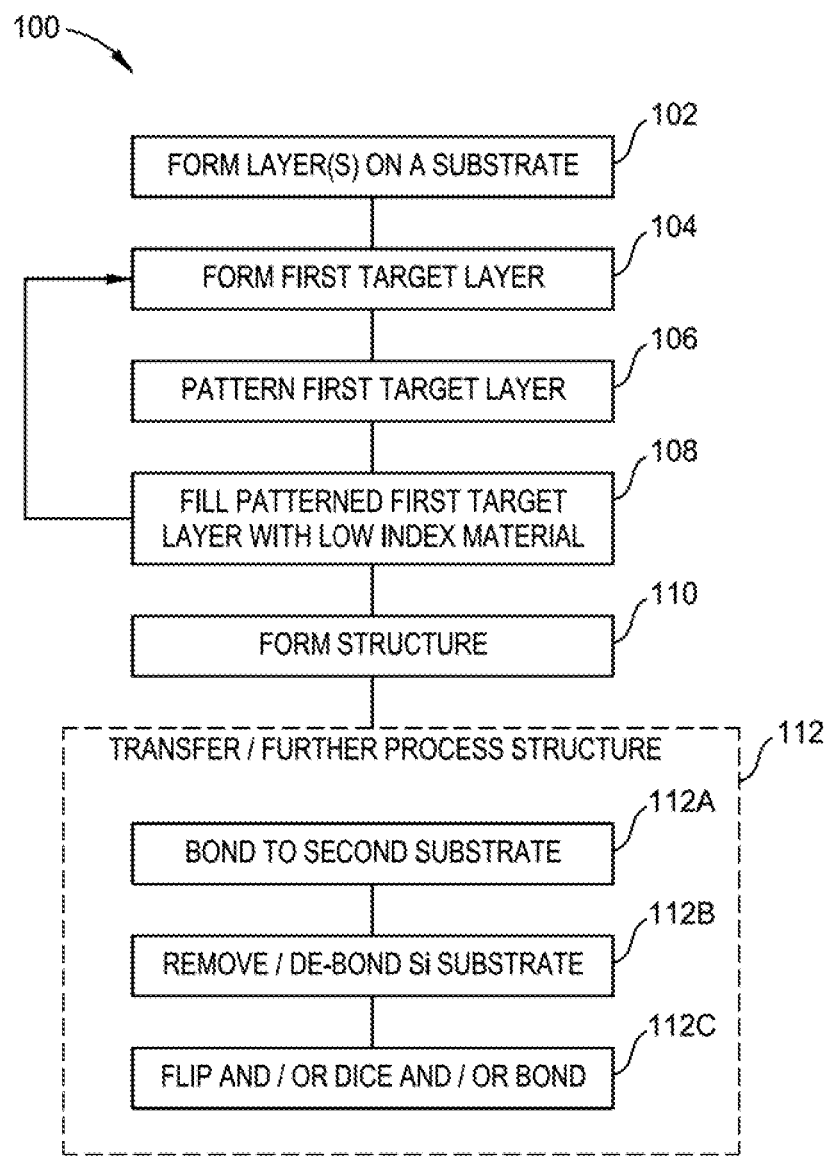
FIG. 1 is a flow chart of a method of fabricating optical devices according to embodiments of the present disclosure.

The systems and methods discussed herein may include the mass production of optical devices, including double-sided and stacked optical element layers. As discussed herein, an "optical device" is a device configured to have a predetermined effect on light introduced therein. Optical devices can include one or more optical element layers. An "optical element layer" includes one or more optical elements that may or may not have encapsulation (fill) material formed thereon. The optical element layers discussed herein include positive features that can be referred to herein as islands. Each island of an optical element layer is separated from an adjacent island by a negative feature, referred to herein as a trench. In some examples, trenches can be filled with fill materials. Depending upon the example, islands and trenches can be formed from either high or low refractive index materials. The islands and trenches can have various top-view and cross-sectional dimensions, including polygonal, rounded, tapered, and combination geometries. The islands, and thus the trenches, can be arranged, in a top-down view, in ordered arrays, random arrays, patterned arrays, or combinations thereof. An optical element comprises a single island or trench feature which individually contributes to the optical response of light introduced to the optical device.

The optical devices contemplated herein can include lenses, dot projectors or holographic projectors, color filters, and collimators, as well as elements and components thereof. In some examples, the optical devices discussed herein can be implemented in augmented reality devices. In order to make broadband elements and other optical devices for short wavelength light, the nano-sized optical elements in an optical element layer can have, for example, a maximum dimension of less than about 100 nm. Alternative patterning methods may be used to pattern these structures. In some examples, nano Imprint (NIL) or EUV lithography may be employed. In one embodiment, nano-imprint lithography may be employed to imprint a hardmask, and then to directly etch features based upon the hardmask imprint without performing a hardmask etch. Further, nano-imprint lithography may be employed to form the optical element layers directly on the substrate. The systems and methods discussed herein enable the consistent formation of both high aspect ratio features with aspect ratios of 20:1 or greater, and low aspect ratio features with aspect ratios, for example, from 1:1 to 1:3.

In one example, the optical devices are fabricated without using glass substrates. In another example, the optical devices are fabricated to include glass substrates. In one embodiment, target layers formed on top of a silicon (Si) substrate are patterned and subsequently transferred to a device or transparent substrate. As discussed herein, a transparent substrate is a substrate that is optically transparent in a predetermined wavelength range within which the optical device is intended to operate. The target layer can be a low index material or a high index material, depending upon the embodiment. Target layers can be single layers or can include one or more stacked layers of the same composition or of varying compositions. The methods herein can further include stacking the patterned target layers directly onto completed devices while still on the original substrate, before dicing, if dicing is performed. For example, optical element layers can be stacked directly onto a substrate of completed charge-coupled devices (CCD), or complementary metal-oxide semiconductor (CMOS) image sensors, light-emitting diodes (LED), a micro-LED (uLED) display, organic light-emitting diode (OLED) or vertical-cavity surface-emitting laser (VCSELs) or another substrate. The methods discussed herein are a form of Integrated Processing.

In one example, the optical devices discussed herein are formed to include a fill layer. The fill layer is formed in between optical elements of an optical element layer. The fill layer can include an interlayer, which is a portion of the fill layer formed in between and on top of the optical element layers to form a space in between optical element layers of stacked optical element layers. The fill layer can be engineered for specific functions associated with various wavelengths. Thus, the optical element layers discussed herein can be configured as independent optical element layers or interactive optical element layers. Nano-imprint lithography may also be employed to imprint a pattern of features directly on to a substrate, after which a fill material is subsequently deposited, which may involve inkjet, slot-die, spin-coating, or otherwise forming the inter-element (optical element) material, resulting in a low cost process. In alternate embodiments, chemical vapor deposition (CVD), physical vapor deposition (PVD), or atomic layer deposition (ALD) may be employed to form the optical element layers and/or the fill layers discussed herein. The shapes of the optical elements in the optical elements layers of the optical devices discussed herein range from geometries as simple as circles, triangles, or polygons, to complex shapes that can be combinations of various geometries.

In another example, the optical devices may be fabricated by imprinting a negative tone of a target layer of the functional devices. The negative tone is a pattern that includes islands and trenches formed in the target layer, which can be a low-index material. The trench fill material can then be formed by atomic layer deposition (ALD) or chemical vapor deposition (CVD). If a low-index material is used for the target layer, a trench fill material such as amorphous silicon (a-Si), SiN, $TiO_2$, GaP, or other material can be deposited in and/or on the trenches to form the optical elements of the optical element layer. In one example, a-Si or SiN may be used for optical wavelength bands near an IR range, and $TiO_2$ may be used for optical wavelength bands near visible light ranges. The trench fill material can be formed by spinning-on, CVD, or ALD. Subsequently, another layer of low-index material, such as silicon dioxide, doped silicon dioxide, fluorinated polymers, or other suitable porous materials, can be formed on the fill layer. This layer of low-index material can act as an interlayer to separate optical element layers (high-index material layers) instead of additional transparent substrates.

In some examples, the low-index materials discussed herein are self-planarizing materials and chosen in part for that characteristic since, in some embodiments, planar surfaces are used for optical element manufacture. In other examples, chemical-mechanical planarization (CMP) is used to achieve a predetermined flatness of one or more layers including the low-index layers. The flatness may be within a tolerance from between 1 nm to 5 nm. In some examples, the flatness tolerance is 2 nm. In other examples, the flatness tolerance can be less than 1 nm or greater than 5 nm, depending upon the optical device being fabricated.

In other examples, double-sided optical devices are formed on a transparent substrate that separates the optical elements in adjacent optical element layers. The transparent substrate can have a thickness from 10 µm to 3 mm or greater. In this example, two target layers are each formed on different temporary substrates. Each target layer is patterned, where the patterning can occur sequentially or simultaneously, or in an overlapping fashion. Depending upon the embodiment, each target layer can be a low-index or a high-index material. Each patterned target layer can be optionally filled. Each patterned target layer is bonded to a third substrate. The third substrate can be a transparent substrate and acts as an interlayer that separates the two patterned target layers. The patterned target layers can be subsequently de-bonded from each respective temporary substrate. In one example, pattern masters can be formed to fabricate the patterns in one or both target layers. Imprint masters can be used to directly imprint target layers and/or hardmasks for patterning. In one example, a first pattern master is used to form a first pattern in a first target layer and a second pattern master is used to form a second pattern in a second target layer.

In another example, a target layer on a substrate is patterned on a single side using nanoimprint lithography (NIL). The pattern formed in the target layer can be filled with a fill material, bonded to a second substrate, and then separated from the original substrate. In another example, a first target layer on a first substrate and a second target layer on a second substrate are patterned. The first substrate and the second substrate are bonded together to form a layer from 10 µm to 3 mm or greater in thickness. The first substrate and the second substrate can be of similar thicknesses or of differing thicknesses. Depending upon the embodiment, the target layers can be patterned by extreme ultraviolet lithography (EUV), nano-imprint lithography (NIL), and/or etching.

FIG. 1 is a flow chart of a method 100 of fabricating optical devices according to embodiments of the present disclosure. In one embodiment, the method 100 is a batch process involving a plurality of substrates that are fabricated simultaneously. At operation 102, a first layer that may be a protective layer and/or a de-bonding layer is formed on a first substrate, such as a Si substrate or another substrate such a polymer or another material that may be transparent within a predetermined wavelength range. In one example of the method 100, glass is not used as the substrate. In one example, the substrate is a finished device such as CCD, CMOS, VCSEL, LED, or other structure that acts as a substrate upon which the optical devices discussed herein may be directly fabricated. That is, there can be an in-situ fabrication of the optical devices discussed herein, described in further detail in the method 100 and 400 in FIGS. 1 and 4. The first layer formed at operation 102 may be a protective layer formed from SiN, $SiO_2$, or may be a de-bonding layer formed from high temperature glue. In one example, the high temperature adhesive used can withstand temperatures of up to temperatures on the order of 280° C. In some examples, the first layer formed at operation 102 is a combination of a protective layer formed on the substrate and a de-bonding layer formed on the protective layer.

At operation 104, a first target layer is formed on the de-bonding layer. Target layers, as discussed herein, can be low or high-index materials that are patterned through various operations. The first target layer can be formed from a-Si, SiN, $TiO_2$, GaP, or other material(s) suitable for the formation of a plurality of optical elements. At operation 106, the layer formed at operation 104 is patterned (etched) via a wet or a dry-etch operation to form a plurality of trenches to expose the de-bonding layer formed at operation 102. Subsequent to patterning the first target layer at operation 106, a plurality of low-refractive-index material or materials are formed on the patterned first target layer at operation 108 via CVD, ALD, PVD, or a spin-on process. Further in an embodiment at operation 108, CMP is used to achieve a predetermined flatness that may be from 1 nm to 5 nm across the layer surface.

The plurality of low-index materials that may be employed at operation 108 can be formed from silicon dioxide, doped silicon dioxide, fluorinated polymers, nanoparticle films, or porous materials. Low-index materials are discussed herein in contrast to "high" index materials such as amorphous and crystalline silicon, silicon nitride, titanium dioxide, gallium phosphide, tantalum pentoxide, gallium nitride, sulfur-inated materials, polymers, and other materials with appropriate optical properties. It is contemplated that materials and combinations of materials can be used to form the fill layers and/or the optical element layers discussed herein, and that these materials can be selected based on the targeted optical properties of the optical device(s) fabricated in the method 100.

The low-index material(s) formed at operation 108 are formed on top of the target layer and in the trenches formed in between islands of the target layer as shown below in FIGS. 2A-2I. A top surface of the low-index material may be parallel to the substrate. This layer may be of varying thicknesses up to about 10 microns or greater. Operations 104-108 may be employed to form a single optical element layer. In other examples, operations 104-108 can repeated for a plurality of iterations (cycles) that may employ the same or differing materials, heights, and patterns. Depending on the example, stacked optical element layers can be formed from the same or different materials. This cycle (of operations 104-108) can be repeated from 2-100 times to form a plurality of stacked optical element layers.

In one embodiment, the low-index materials can be used for fill layers and act to encapsulate the optical elements of an optical element layer. The fill layer can be formed to include an interlayer that extends above the top surface of the optical elements of a first optical element layer to separate the optical elements of the first optical element layer from the optical elements of a second optical element layer. Thus, the optical elements of different optical element layers are not in contact. The lower the refractive index of the material used for filling/encapsulation, the lower the aspect ratio of the constituent nanostructures (features patterned) for each optical element. In an embodiment, lower aspect ratios produce thinner optical element layers, as well as faster and cleaner etching. Thus, the systems and methods herein result in more efficient fabrication processes in terms of time, cost, and complexities. In another example, where a fill material has a high refractive index, the height of the optical elements, and thus of the optical element layer, increases.

Subsequent to forming a predetermined number of optical element layers via operations 104-108, an optical element structure having one or more optical element layers is formed at operation 110. As discussed herein, optical element structures are structures formed during various operations of optical device fabrication. The optical element structure can be a final optical device, or can be further processed via thermal, mechanical, or thermo-mechanical operations. In one example, subsequent to forming the optical element structure at operation 110, one or more processes may occur at operation 112. These operations at 112 may vary based upon whether a de-bonding and/or protective layer is used in the fabrication, as well as an end use of the optical device.

In one example, at operation 112A, a second substrate may be bonded to a low-index layer, opposite to the first substrate. Subsequently at operation 112B, the first substrate is removed. The removal at operation 112B may be performed by etching, grinding, polishing, thermal, or other operations or combinations of operations designed to heat an adhesive de-bonding layer past a predetermined temperature. At operation 112C, the optical element structure may be further processed including dicing and/or bonding to a secondary structure, which may include a transparent substrate or a device such as a CCD, CMOS, VCSEL, LED, or other structures. In various embodiments, the process or processes at operation 112 can include stacking two or more optical element layers directly on completed devices while the optical element layer remains coupled to the substrate from operation 102.

In another example, operations 104-110 may be executed on a target layer or layers formed on a finished device, such as a CCD, CMOS, VCSEL, LED, or other device that acts as a substrate. In this example, the optical element layer or layers are formed in-situ on the device substrate. In this example, at an operation 112, further operations such as dicing may occur. In an example where there is no de-bonding layer used, there is no removal of a first substrate via de-bonding. In various embodiments, the optical element layers may be permanently bonded to a permanent transparent substrate. The permanent transparent substrate may be formed from a glass, a polymer, or other materials as appropriate for various applications. This assembly can then be diced into smaller optical devices. Each optical device can be attached to a final device, or can be bonded as a wafer or sheet to an array of devices on a wafer or sheet. For example, the optical element layers may be stacked on to a substrate of a completed CCD device, CMOS image sensors, or VCSELs in what can be referred to as "Integrated Processing." In one example, the first substrate is removed via a thermal operation that melts or degrades the de-bonding layer until both the de-bonding layer and the first substrate are removed from the optical element structure. For example, if a de-bonding material that is heat resistant up to 280° C. is employed, the substrate may be removed by heating the optical element structure above about 280° C. to remove the substrate.

Figure 2A:
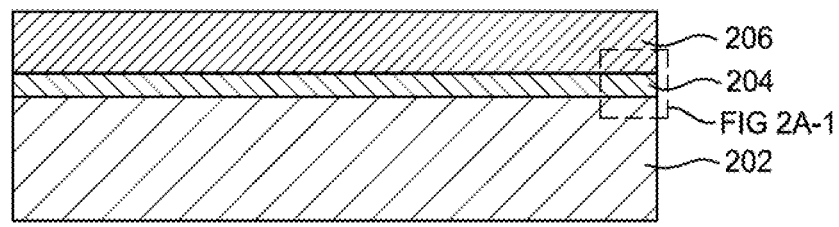
FIGS. 2A-2I is a series of partial schematic illustrations of cross-sections of optical element structures formed during optical device fabrication according to embodiments of the present disclosure.
Figures 1, 2A:
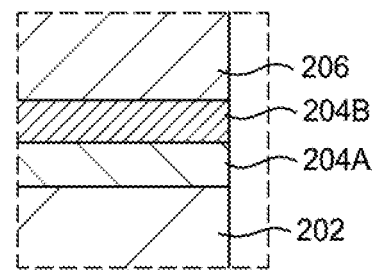

FIGS. 2A-2I is a series of partial schematic illustrations of cross-sections of optical element structures formed during optical device fabrication according to embodiments of the present disclosure. FIG. 2A shows a first substrate 202. In one example, the first substrate 202 can be referred to as a temporary substrate and can be formed from Si. In alternate embodiments, the first substrate 202 may be a finished device such as a CCD, CMOS, VCSEL, LED, or other device structure as appropriate. The first substrate 202 can be bonded via a de-bonding layer 204 to a first target layer 206. In an example where the first substrate 202 is a finished device, the de-bonding layer 204 may not be employed since the finished device is the permanent substrate. In one embodiment, glass is not used as the first substrate 202. In an embodiment, the de-bonding layer 204 may be a single layer of high temperature adhesive or a protective dielectric layer.

In other embodiments, as shown in the inset (FIG. 2A-1) in FIG. 2A, the substrate includes a de-bonding interlayer 204A on the first substrate 202 and a barrier interlayer 204B on top of the de-bonding layer opposite the substrate. The de-bonding interlayer 204A, or 204 when used as a single layer, can include glue or other adhesive configured to withstand temperatures up to about 280° C. and is from 1 nm to 100 nm thick. In another example, not shown here, the de-bonding layer 204 can include solely a dielectric layer of $SiO_2$ or SiN from 1 nm to 100 nm thick and is formed by PVD, CVD, or other deposition operations. In other examples, the de-bonding layer 204 can be greater than 100 nm thick. In an embodiment, FIG. 2A may correspond to operation 102 in FIG. 1. The first target layer 206 can include a variety of materials as discussed herein such as a-Si, SiN, $TiO_2$, or GaP.

Figure 2B:
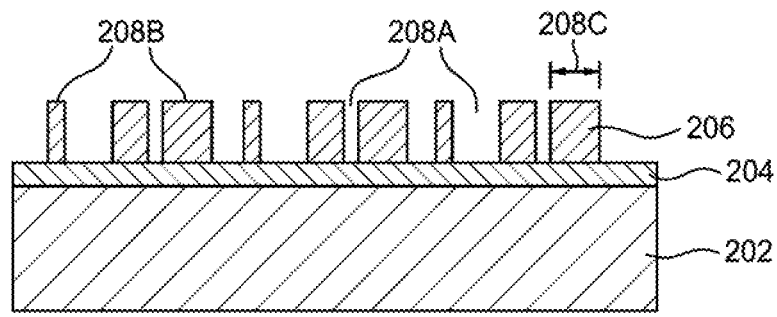

FIG. 2B shows the device of FIG. 2A and further includes a patterned (etched) first target layer 206. The first target layer 206 is patterned to have a plurality of negative features, referred to as a plurality of trenches 208A, and a plurality of positive features, referred to as a plurality of islands 208B. In an embodiment, FIG. 2B illustrates an optical element structure resulting from operation 106 in FIG. 1. Each island of the plurality of islands 208B can have a width 208C, as measured parallel to the first substrate 202. In one example, the width 208C of each island of the plurality of islands 208B can vary within an optical element layer. While the optical elements are illustrated herein as having approximately square or rectangular-shaped cross-sections, it is contemplated that the optical elements can, in other examples, include tapered sidewalls and thus form a trapezoidal cross-section (not pictured).

Figure 2C:
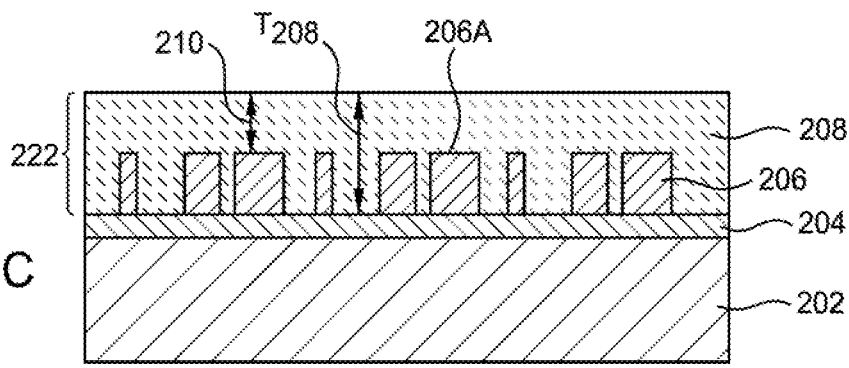

FIG. 2C illustrates an optical element structure that includes a first low-index layer 208. The first low-index layer 208 is formed over a top surface 206A of the islands 208B and in between the islands 208B, e.g., in the trenches 208A. In an embodiment, the first low-index layer 208 extends a distance 210 above a top surface 206A of the first target layer 206. The distance 210 is part of the thickness ($T_{208}$) of the first low-index layer 208. Accordingly, the first low-index layer 208 can include an interlayer because the distance 210 acts to separate the first target layer 206, e.g., an optical element layer, from subsequently stacked optical element layers. The structure of FIG. 2C may be similar to that formed in operation 108 in FIG. 1 and can be referred to as a first optical element layer 222. As discussed above, the distance 210 can include an interlayer since this distance separates a first optical element layer 222 from subsequently formed optical element layers. The first low-index layer 208 can be tuned (e.g., via material type and/or thickness) among and between optical element layers to various distances to produce desired effects for single or multiple (doublet, triplet, or more) optical device embodiments. The first optical element layer 222 can be referred to as a singlet.

Figure 2D:
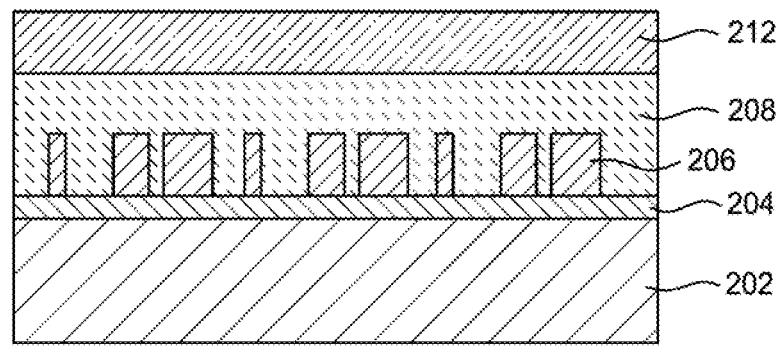
Figure 2E:
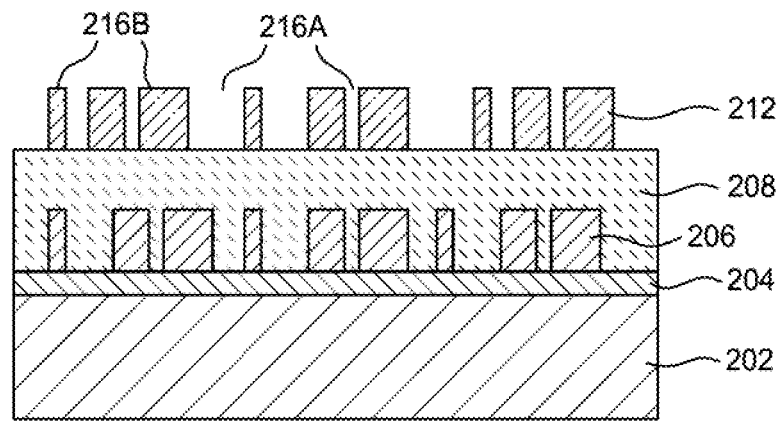
Figure 2F:
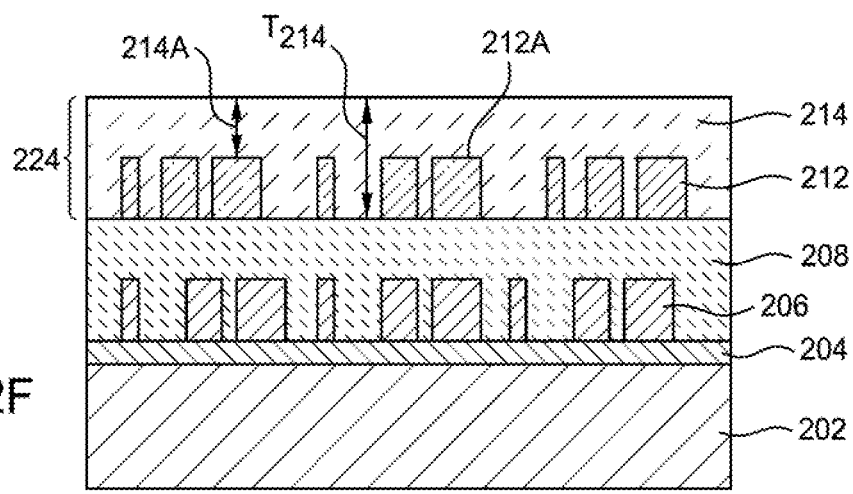

FIGS. 2D-2G illustrate examples of iterations of a cycle of operations 104-108 in FIG. 1. In an embodiment, FIG. 2D shows a second target layer 212 formed on the first low-index layer 208. FIG. 2E shows a plurality of trenches 216A and a plurality of islands 216B formed in the second target layer 212 in response to patterning. In FIG. 2F, a second low-refractive index material forms a second low-index layer 214, formed in a similar fashion to the first low-index layer 208. The structure formed by the second low-index layer 214 and the second target layer 212 can be referred to as a second optical element layer 224. The second low-index layer 214 may be formed to extend a distance of 214A beyond a top 212A of the second target layer 212. In an embodiment, two different materials may be employed for each of the first target layer 206 and the second target layer 212.

In some examples, which can be combined with other examples and embodiments herein, different materials may be employed for each of the first low-index layer 208 and the second low-index layer 214. In an embodiment, the first optical element layer 222 may be configured for a first wavelength or first range of wavelengths, and the second optical element layer 224 may be a configured for a second wavelength or second range of wavelengths. The first target layer 206 and the second target layer 212 can include the same or different patterns. The first target layer 206 and the second target layer 212 can each have the same or differing pattern properties including height (thickness), spacing, and material type, depending upon the embodiment. The combination of the first optical element layer 222 and the second optical element layer 224 may be called a doublet.

In an embodiment, two different materials may be employed for each of the first target layer 206 and the second target layer 212. In another example that can be combined with other examples, two different materials may be employed for each of the first low-index layer 208 and the second low-index layer 214. In another embodiment, the same materials may be employed for each of the first target layer 206 and the second target layer 212. In another example, which can be combined with other examples and embodiments, the same materials may be employed for each of the first low-index layer 208 and the second low-index layer 214. Each of the first low-index layer 208 and the second low-index layer 214 has a thickness $T_{208}$, $T_{214}$, respectively. The thickness of each of the first low-index layer 208 and the second low-index layer 214 includes a distance that the respective low-index layer extends beyond the top surface of the optical elements. For example, the first low-index layer 208 and the second low-index layer 214 extend, respectively, from each top surface 206A and 212A for distances 210 and 214A, which may be the same or different distances. Thus, each of the first optical element layer 222 and the second optical element layer 224 can be a different height. In another example, each of the first optical element layer 222 and the second optical element layer 224 can be the same height depending upon the embodiment. The extension of each fill layer beyond the optical elements may be employed as an interlayer in place of glass substrates or in place of additional layers of other materials.

Figure 2G:
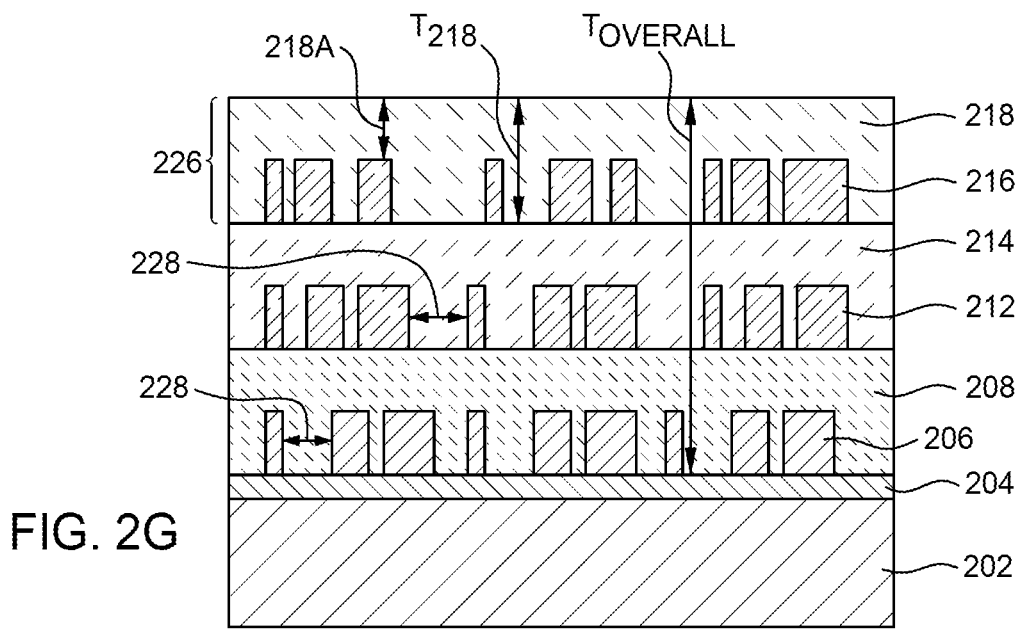

FIG. 2G shows a third optical element layer 226 formed from a third target layer 216 and a third low-index layer 218. The third low-index layer 218 can be formed from the same as or different materials than the target layers and low-index layers used in other optical element layers such as the first optical element layer 222 and second optical element layer 224. The third low-index layer 218 has a thickness $T_{218}$ which includes a distance 218A that the third low-index layer 218 extends beyond the third target layer 216. The distance 218A may be the same as or different than the distances 210 and 214A, and the optical element layers 222, 224, and 226 may be configured using various thicknesses and thickness ratios. For example, ratios such as the thickness of the optical element layer: the thickness of the low-index layer; or dimensions among and between optical elements layers; or dimensions among and between fill layers, etc.) to produce desired effects. In an embodiment, each of the distances 210, 214A, and 218A may be from about 1 micron to about 50 microns and, in some embodiments, may be from 50 nm to 2 microns, for example, if the optical element layers 222, 224, and/or 226 are configured to be optically interacting. The combination of the first optical element layer 222, the second optical element layers 224, and the third optical element layer 226 may be called a triplet. In one example, at least one of the distances 210, 214A, and 218A is less than 1 micron, and in other examples, at least one of the distances may be from about 50 nm to about 300 nm.

Figure 2H:
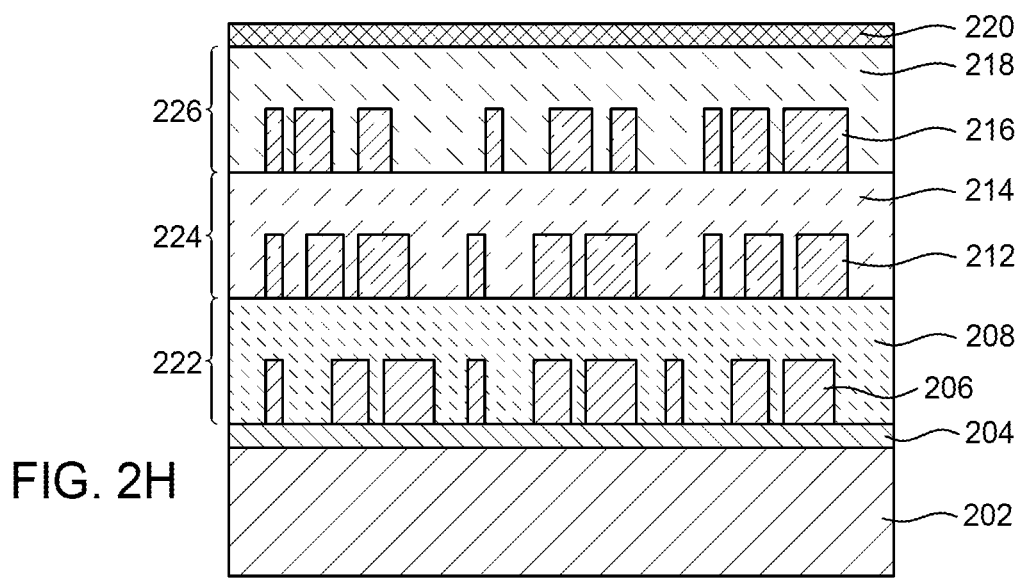
Figure 2I:
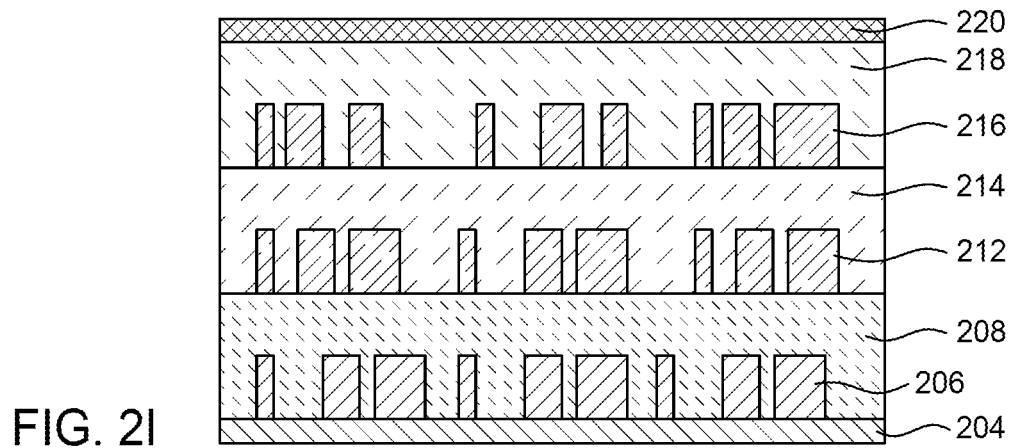

While three optical element layers 222, 224, and 226 are shown in FIGS. 2G-2I, it is contemplated that, in various embodiments a single optical element layer such as that shown in FIG. 2C, or a double optical element layer as shown in FIG. 2F may also be employed. In other examples, four or more optical element layers can be stacked to form an optical device. In an embodiment, $T_{208}$, $T_{214}$, and $T_{218}$ may each be from about 100 nm to about 2 microns. In an embodiment, an overall thickness $T_{overall}$, shown in FIG. 2G, of an optical device, which can include a one or more stacked optical element layers may be from about 1 micron thick to about 2000 microns thick or thicker. In an embodiment, a color filter or an interference filter or other optically filtering layer may be formed on the optical element layer stack, for example, on top of the one or more optical element layers such as the first optical element layer 222, the second optical element layer 224, or the third optical element layer 226, depending upon how many optical element layers are employed in the example embodiment.

FIG. 2G further illustrates an example spacing 228 between optical elements formed in the first target layer 206. In an embodiment, a spacing 228 between optical elements may vary among and between optical elements formed in the first target layer 206 and among and between the target layers 206, 212, and 216. In one example, a spacing 228 between elements is more than one wavelength in the encapsulating material (e.g., the first low-index layer 208), where a wavelength may be equal to a spacing 228 of about 1 micron. In one example, an IR optical device may be fabricated using a single optical element layer, a doublet, or a triplet, or a larger stack. In another example, an RGB optical device may be fabricated using a singlet or doublet optical device. In another example, a white light or other broadband optical device may be fabricated from a doublet, a triplet, or an optical device including more than three optical element layers. In some examples, a white light optical device can be fabricated using a single optical element layer.

FIGS. 2H and 2I illustrate a transfer process for a plurality of optical element layers fabricated according to embodiments of the present disclosure. In FIG. 2H, a second substrate 220 is bonded to the third optical element layer 226 which can be referred to as the "top" or as the "outermost" optical element layer in this example. The second substrate 220 may be fabricated from glass, plastic, or other materials and may be optically transparent. In FIG. 2I, the first substrate 202 is removed and the optical element structure may be subsequently rotated. In one example, the structure can be rotated 180 degrees. In another example, the structure can be divided into a plurality of separate elements. Other subsequent operations may be performed before, after, or without dicing or removal of the first substrate 202, as discussed in detail herein.

Figure 3:
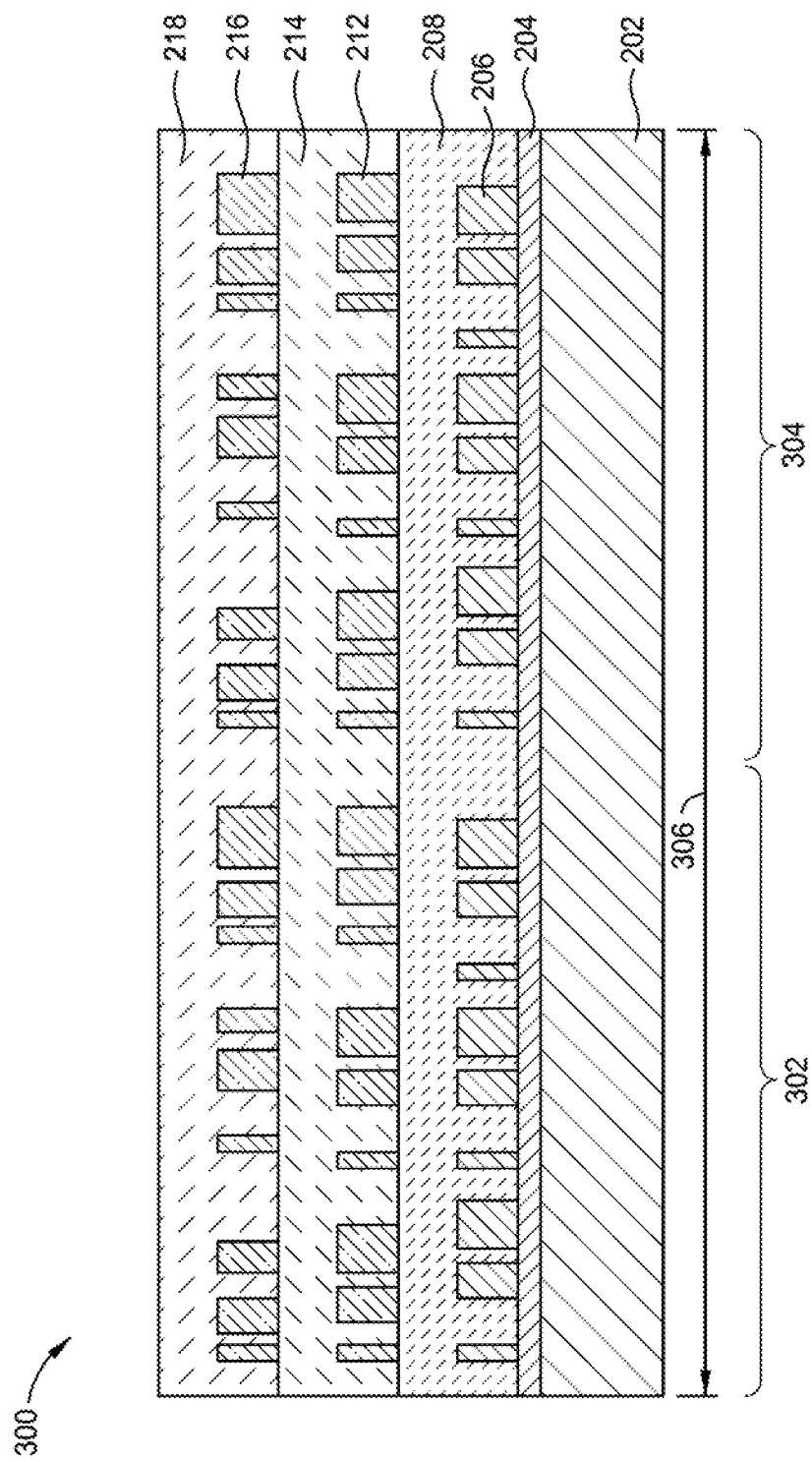
FIG. 3 is a partial schematic illustration of a cross-section of an optical element structure according to embodiments of the present disclosure.

FIG. 3 is a partial schematic illustration of a cross-section 300 of an optical element structure according to embodiments of the present disclosure. FIG. 3 shows a first portion 302 that may be similar to that which is illustrated in FIGS. 2A-2G, and a second portion 304 which is identical to the first portion 302. FIG. 3 is shown to illustrate an extended pattern that may be repeated across an optical element structure and diced (divided) subsequently. In an embodiment, a width 306 of the first substrate 202 may be such that a plurality of individual optical devices may be formed via dicing such that each diced portion has a maximum diameter from 1 mm to 4 cm. In other examples, each diced portion can have a maximum diameter greater than 4 cm. The diced optical devices may be formed to be of the same size or of varying sizes, depending upon the embodiment. While the optical elements of the optical element layers 206, 212, 216 are shown as polygon-shaped, it is contemplated in other examples that the optical elements can have cross-sectional geometries that include rounded, triangular, or polygonal shapes, or combinations thereof. Further, it is contemplated that the cross-sectional geometries may be tapered, angled, bowed, or otherwise configured in various geometries.

Figure 4:
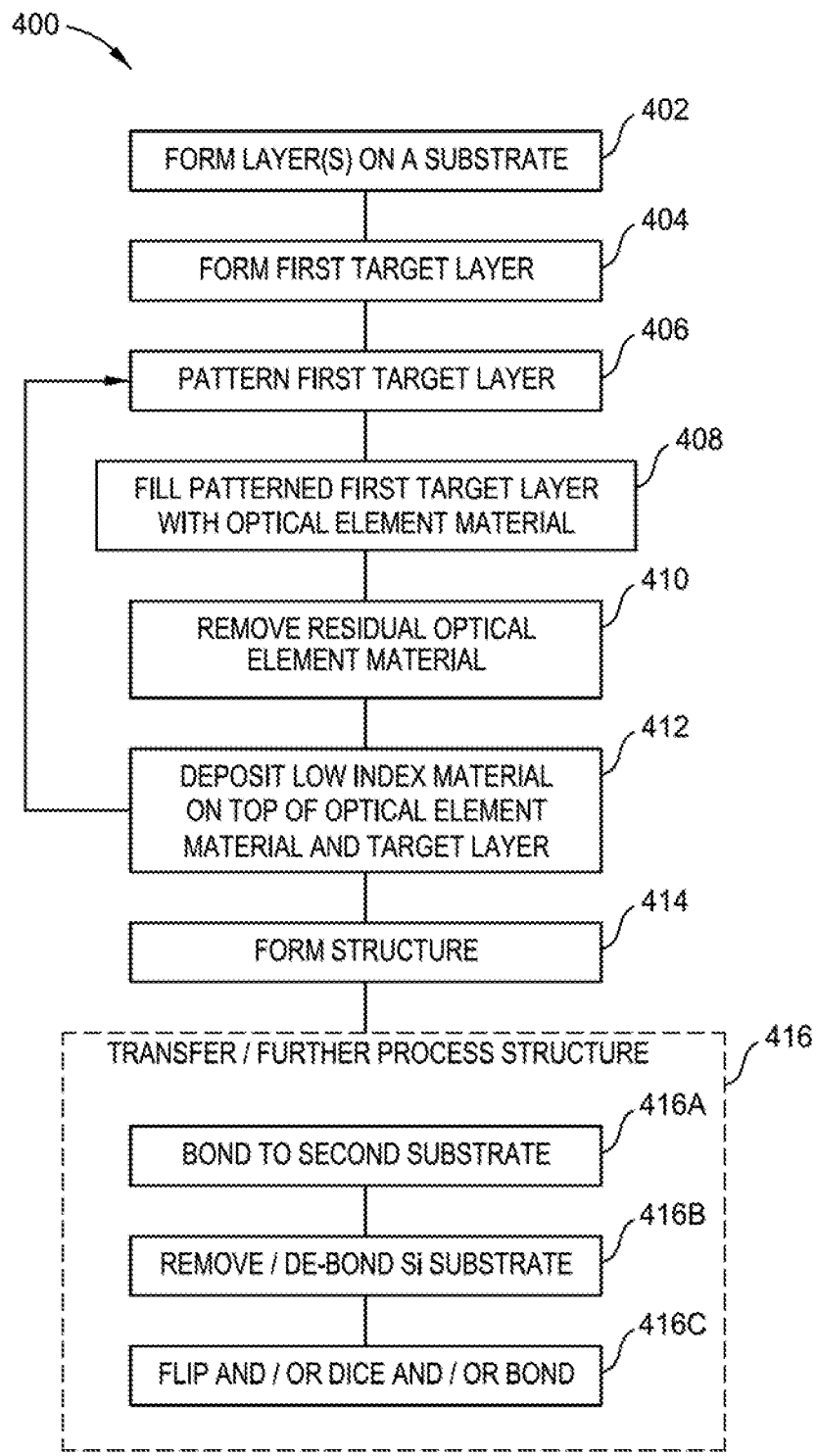
FIG. 4 is a flow chart of a method of fabricating optical elements according to embodiments of the present disclosure.

FIG. 4 is a flow chart of a method 400 of fabricating optical elements according to embodiments of the present disclosure. In the method 400, at operation 402, a layer that may be a de-bonding layer and/or a protective layer may be formed on a substrate as discussed above. A target layer may be formed on the de-bonding layer at operation 404, the target layer may be patterned at operation 406 to form a plurality of trenches to expose the de-bonding layer. The patterning at operation 406 may be done via dry or wet etching or via a nano-imprint operation. At operation 408, a material such as a a-Si, SiN, TiO$_2$, GaP or others may be deposited in the plurality of trenches and across a top surface of the patterned target layer. At operation 410, a plurality of residual material, for example, that which was formed across the top surface of the optical element layer, is removed to expose the optical element layer while the trenches remain filled with the material. At operation 412, subsequent to the removal of the plurality of residual material at operation 410, a plurality of low-refractive index material is formed on the resultant planar surface. In some examples, at operation 412, CMP is used to achieve a predetermined flatness of the low-index material.

Operations 406-412 may be employed to form a single optical element layer. In other examples, operations 406-412 can be repeated for a plurality of iterations (cycles) to form a stack of optical element layers. Each optical element layer of the stack can have the same or differing optical element layer materials, heights, and patterns. If fill materials are included in one or more optical element layers of the stack, the fill materials used for each fill layer can be the same or different low-index materials. This cycle of operations 406-412 may be repeated from 2-100 times to form a plurality of optical elements. Subsequent to forming a predetermined number of optical element layers via operations 406-412, an optical element structure is formed at operation 414 that can include one or more optical element layers. At operation 416, the optical element structure 414 can be further processed. In one example, at operation 416A, a second substrate may be bonded to a low-index layer opposite to the first substrate, and, subsequently at operation 416B, the first substrate is removed. The second substrate can be a transparent substrate or a device such as a CCD, CMOS, VCSEL, an LED, OLED, or uLED. At operation 416C, the structure may be further processed including dicing and/or bonding to a secondary structure.

In various embodiments at operation 416, which may represent one or more operations, the optical element structures may be permanently bonded to another transparent substrate. Subsequent to bonding, the structures can be diced into smaller elements and attached individually to final devices, or the substrate can be bonded as a wafer or sheet to an array of devices on a wafer or sheet. For example, the optical element layers may be stacked on to a substrate of a completed CCD device, CMOS image sensors, or VCSELs or other devices. In another example, operations 406-412 may be executed on a finished device, such as a CCD, CMOS, VCSEL, LED, or other device, such that the optical element layer(s) are formed in-situ on the device. In this example, at operation 416, further operations such as dicing may occur but there is no de-bonding layer used.

Figure 5A:
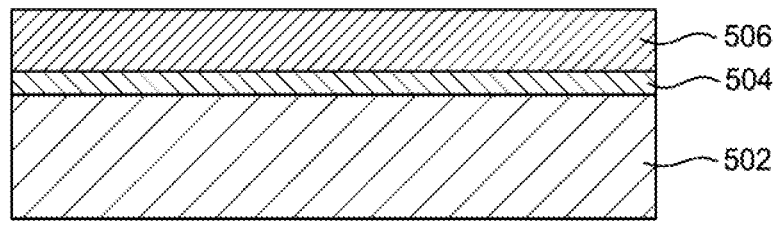
FIGS. 5A-5F is a series of partial schematic illustrations of cross-sections of optical element structures and optical element manufacture according to embodiments of the present disclosure.

FIGS. 5A-5F is a series of schematic illustrations of an alternate method of fabricating optical devices according to embodiments of the present disclosure. FIG. 5A shows a substrate 502 that may be a Si wafer upon which a de-bonding layer 504 is formed. The de-bonding layer 504 may be similar to the de-bonding layer 204 in FIG. 2A and can include a barrier layer (not shown). The barrier layer can be part of the de-bonding layer 504, and can be formed in between an adhesive portion of the de-bonding layer 504 and a target layer 506. In one example, the target layer 506 can be formed from a low-index material. In another example, the substrate 502 is a CCD, CMOS, VCSEL, LED, or other device as appropriate for various applications, and the optical elements are formed in-situ on the substrate 502. The device of FIG. 5A may be formed via operations 402 and 404 discussed in FIG. 4.

Figure 5B:
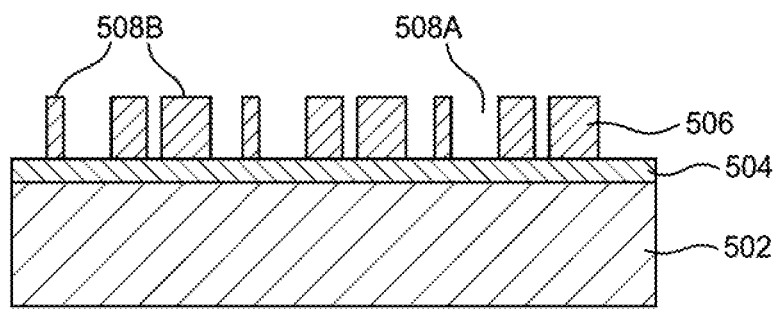
Figure 5C:
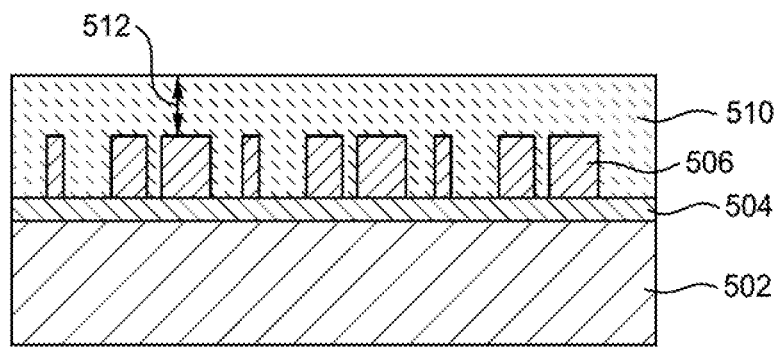
Figure 5D:
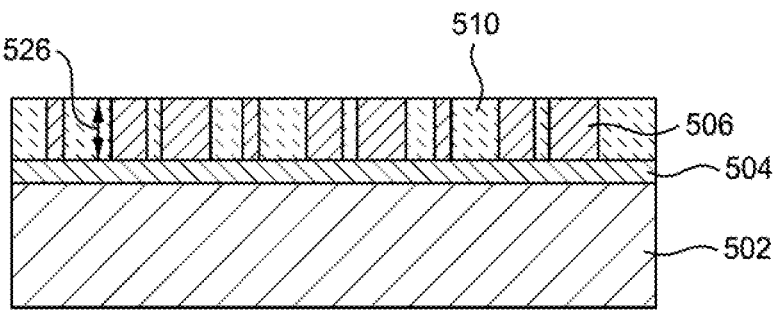

FIG. 5B illustrates a target layer 506 formed on the de-bonding layer 504. The target layer 506 is etched to form a plurality of trenches 508A and islands 508B, as discussed at operation 406 above. In FIG. 5C, a first optical element fill layer (first fill layer 510) may be formed over the target layer 506 and in between the islands 508B and in the trenches 508A, similarly to what is discussed at operation 408. A portion of the first fill layer 510, indicated by a distance 512, is removed as shown in FIG. 5D and discussed at operation 410. FIG. 5D shows an optical element height 526, which may range in some embodiments from about 400 nm to about 1500 nm. In alternate embodiments, the optical element height 526 may be from 100 nm to 400 nm, and in other embodiments the optical element height 526 may be from 50 nm to 100 nm. As discussed herein, the height of optical elements across an optical element layer is the same, creating a flat top surface of the optical element layer.

Figure 5E:
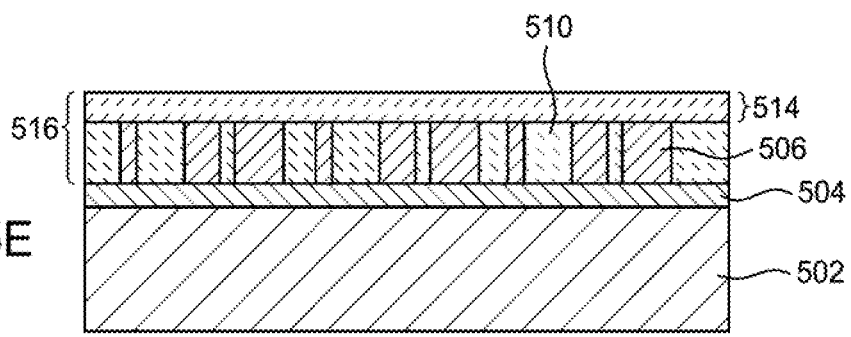
Figure 5F:
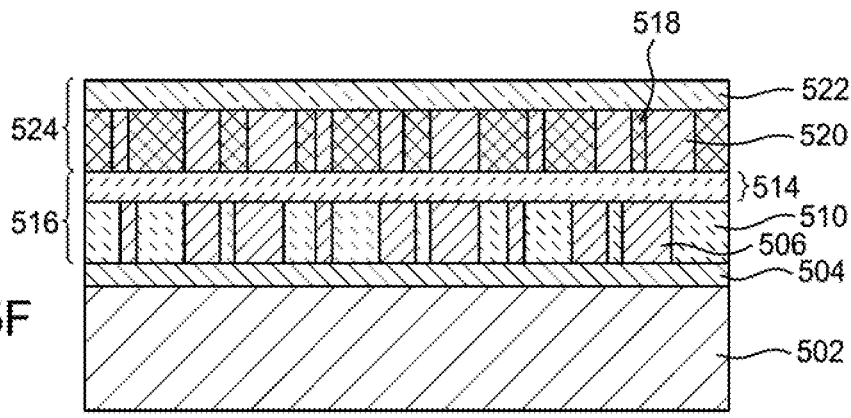

FIG. 5E illustrates a second fill layer 514 formed over the first optical element layer 516 after the removal of a portion of the first fill layer 510, as discussed at operation 410. This operation is discussed at 412 in FIG. 4, and the second fill layer 514 may or may not include the same composition as the target layer 506. The second fill layer 514 can include an interlayer, and may be tuned, for example, in thickness and composition among and between optical element layers structures in order to produce desired effects. The structure in FIG. 5E can be referred to as a first optical element layer 516. FIG. 5F illustrates the structure of FIG. 5E with an additional, second optical element layer 524 formed on the first optical element layer 516. The second optical element layer 524 can be formed in a similar fashion to the first optical element layer 516. The second optical element layer 524 includes second optical elements 520 and a third fill layer 518. The third fill layer 518 can be formed from a low-index material. Another fill layer 522 is formed on top of the second optical elements 520 and the third fill layer 518. The top surface of the second optical elements 520 is co-planar with the third fill layer 518. In one example, a-Si or SiN may be used for optical wavelength bands near an IR range, and $TiO_2$ may be used for optical wavelength bands near visible light ranges.

Figure 6A:
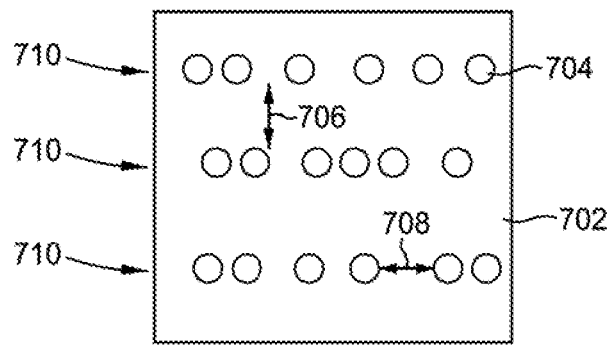
FIGS. 6A-6C are schematic illustrations of a top view of optical element structures according to embodiments of the present disclosure.
Figure 6B:
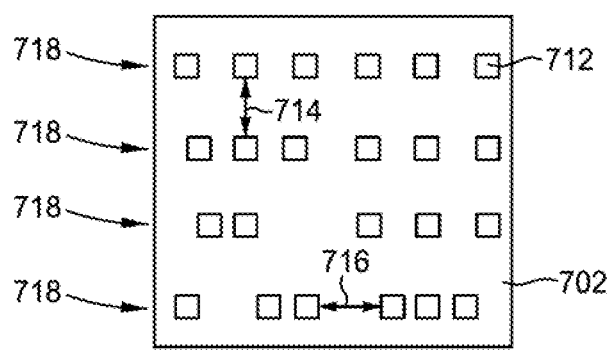
Figure 6C:
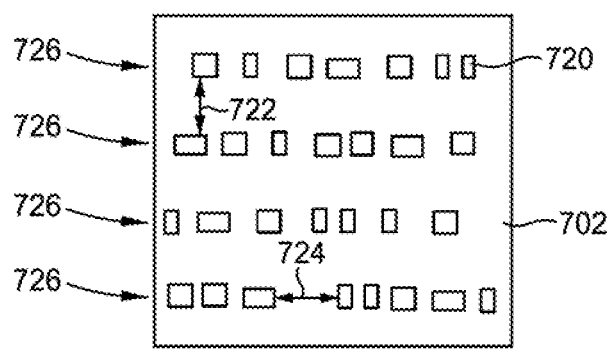

FIGS. 6A-6C are schematic illustrations of a top view of optical element structures according to embodiments of the present disclosure. FIGS. 6A-6C are schematic illustrations of top-down views of optical elements which illustrate only a view of the uppermost optical element. Thus, optical element layers located in lower layers of the optical element layer stacks can include different configurations or the same configuration as that discussed for the top layers shown in FIGS. 6A-6C. FIG. 6A shows a first plurality of optical elements 704 formed on a substrate 702. The first plurality of optical elements 704 are shown to have a top view cross-section of a circle or an elliptical shape. The first plurality of optical elements 704 has a vertical spacing 706 and a horizontal spacing 708. One or both of the vertical spacing 706 and the horizontal spacing 708 can vary among and between the first plurality of optical elements 704, depending upon the embodiment. While three rows 710 of optical elements, including first plurality of optical elements 704, are shown in FIG. 6A, various embodiments can contain more or fewer rows with varied spacing. The rows 710 can be spaced at equidistant intervals, or can be spaced at random intervals.

FIG. 6B shows a second plurality of optical elements 712 formed on a substrate 702. The second plurality of optical elements 712 is shown as having a top view cross-section of a square or other polygonal shape. The second plurality of optical elements 712 has a vertical spacing 714 and a horizontal spacing 716 among and between each pair of adjacent optical elements 712 of the plurality of optical elements 712. Each of the vertical spacing 714 and the horizontal spacing 716 can vary depending upon the embodiment. While four rows 718 of optical elements are shown in FIG. 6B, various embodiments can contain more or fewer rows. While the second plurality of optical elements 712 are illustrated in FIG. 6B as being aligned along a shared axis for each of the four rows 718, in alternate embodiments, the alignment occurs along a perpendicular axis in the direction of the vertical spacing 714. In another example, the second plurality of optical elements 712 can be aligned along both a horizontal and vertical location (axis) to form an ordered array (not shown). In an ordered array example of optical elements, each optical element of the second plurality of optical elements 712 is spaced equidistant in both the horizontal spacing 716 and vertical spacing 714 directions. In various examples, the second plurality of optical elements 712 may have various polygonal or non-polygonal cross-sections and can include sharp edges or rounded edges, or combinations thereof.

FIG. 6C shows a third plurality of optical elements 720 formed on a substrate 702, where the third plurality of optical elements 720 has a top view cross-section of an irregular shape that varies among and between individual optical elements of the third plurality of optical elements 720. The third plurality of optical elements 720 has vertical spacing 722 and horizontal spacing 724 among and between elements that varies depending upon the embodiment. In one example, the vertical spacing 722 is uneven among and between the third plurality of optical elements 720. In another example, the horizontal spacing 724 is uneven among and between the third plurality of optical elements 720. In yet another example, both the vertical spacing 722 and the horizontal spacing 724 of the third plurality of optical elements 720 is uneven. While four rows 726 of optical elements are shown in FIG. 6C, various embodiments can contain more or fewer rows. While the third plurality of optical elements 720 are illustrated in FIG. 6C as being aligned along rows 726, in alternate embodiments, the alignment occurs along a perpendicular axis in the direction of the vertical spacing 722. In another example, the third plurality of optical elements 720 can be aligned in both a horizontal and vertical location to form an ordered array (not shown) where each optical element 720 is spaced equidistant in both the horizontal 724 and vertical 722 directions. The geometries employed for the pluralities of optical elements including 708, 712, 720, and others as discussed herein can be irregular shapes as well as triangles, or other geometries as appropriate for various embodiments. In some examples, diameters of the optical elements vary among and between rows 726. In other examples, the diameters of each optical element 720 in a single row may vary within that row. The top-views shown in FIGS. 6A-6C are illustrative, and it is contemplated that other spacing of optical elements is possible. For example, the spacing of optical elements discussed herein can be varied spacing that is used to created ordered arrays having equidistant spacing among and between optical elements, random arrays, having random spacing, or patterned arrays where regular or irregular spacing patterns can be repeated.

Figure 7A:
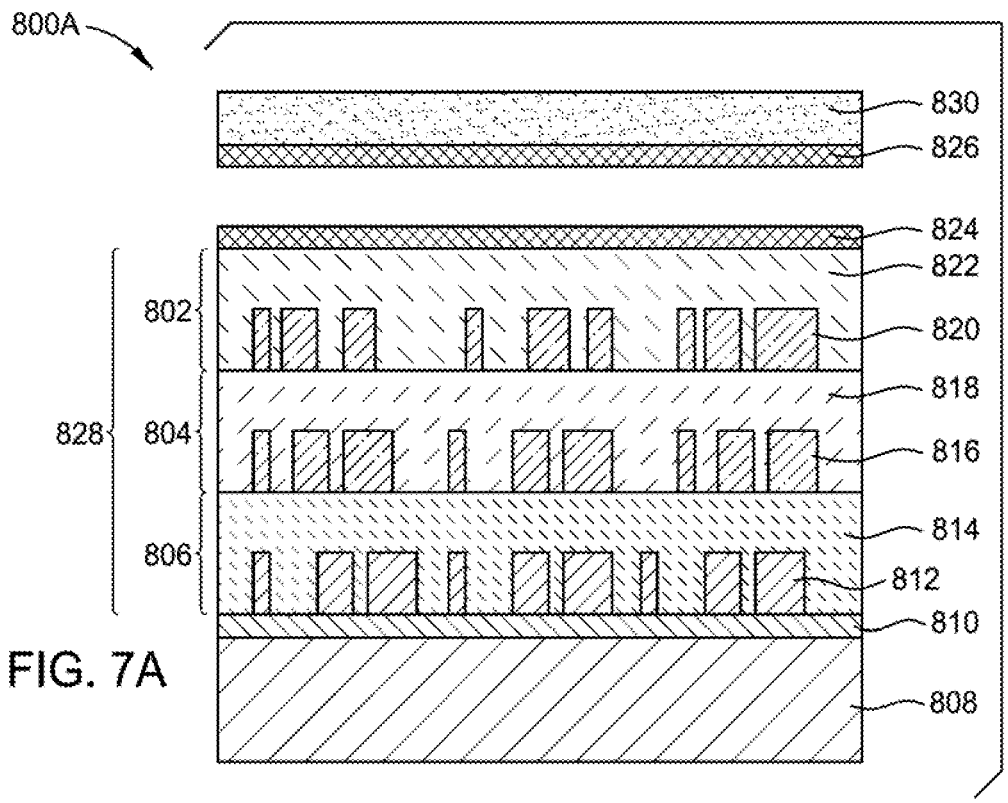
FIGS. 7A-7C are schematic illustrations of a bonding method during optical device fabrication according to embodiments of the present disclosure.
Figure 7B:
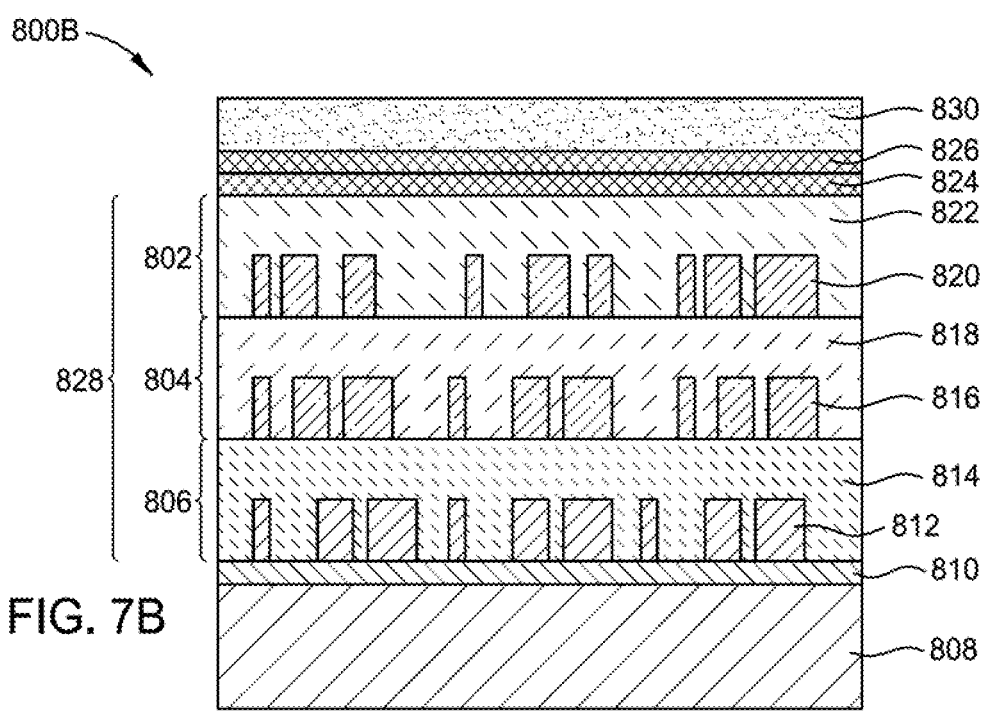
Figure 7C:
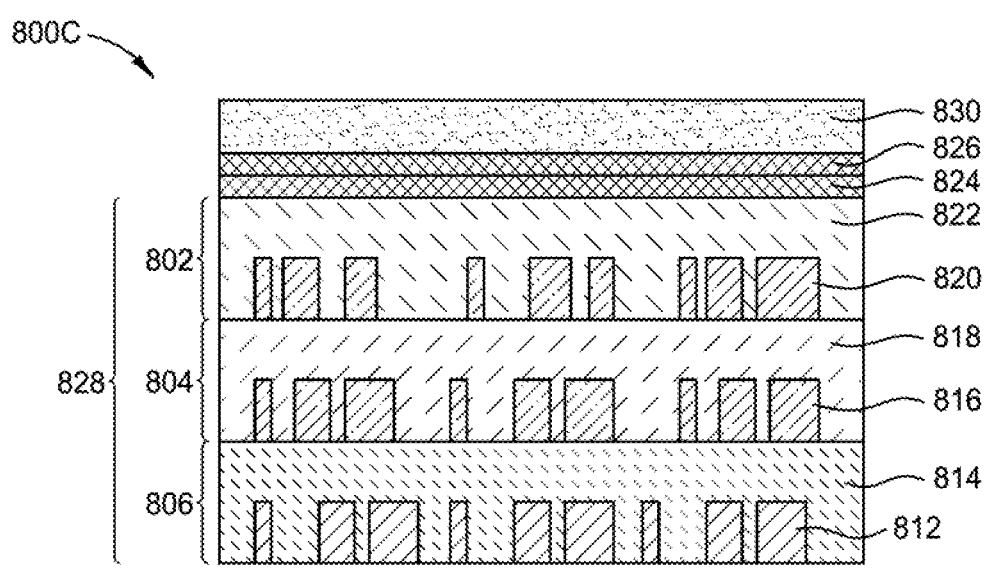

FIGS. 7A-7C are schematic illustrations of a bonding method for an optical element according to embodiments of the present disclosure. FIG. 7A shows a first optical element structure 800A that includes an optical element layer stack 828 of a first optical element layer 802, a second optical element layer 804, and a third optical element layer 806. Each of the optical element layers 802, 804, and 806 includes a plurality of optical elements 812, 816, and 820, respectively. Each optical element layer 802, 804, 806 further includes a layer of low-index material 814, 818, and 822 formed on top of and in the trenches in between each plurality of optical elements 812, 816, and 820. The third optical element layer 806 is formed on a substrate 808. In one example, the third optical element layer 806 has a layer 810 formed between the substrate 808 and the third optical element layer 806. As discussed herein, the layer 810 may be a protective layer, a de-bonding layer, or combinations thereof, and may be formed to have a thickness of 100 nm or greater. The optical element layer stack 828 has a top bonding layer 824 formed on the first optical element layer 802. The top bonding layer 824 has a thickness of 20 nm to 100 nm. A second substrate 830 has a second bonding layer 826 which is formed on the second substrate 830. As discussed above, the second substrate 830 may be a transparent substrate fabricated from glass, polymer, or other materials as appropriate for various applications.

FIG. 7B shows a second optical element structure 800B where the second substrate 830 is bonded to the optical element layer stack 828. The second substrate 830 is bonded to the optical element layer stack 828 via the top bonding layer 824 and a second bonding layer 826 which is formed on the second substrate 830. FIG. 7C shows a third optical element structure 800C which is the structure of the second optical element structure 800B where the substrate 808 has been removed. While three optical element layers, 802, 804, and 806, are shown in FIGS. 7A-7C, a lesser or greater number of optical element layers can be used, depending upon the embodiment. The second substrate 830 may be from 100 microns to 500 microns or greater. In one example, the second substrate 830 can be thinned from an original thickness, for example, from 500 microns to 100 microns, using CMP or other methods after the second substrate 830 is bonded to the third optical element structure 800C.

Figure 8A:
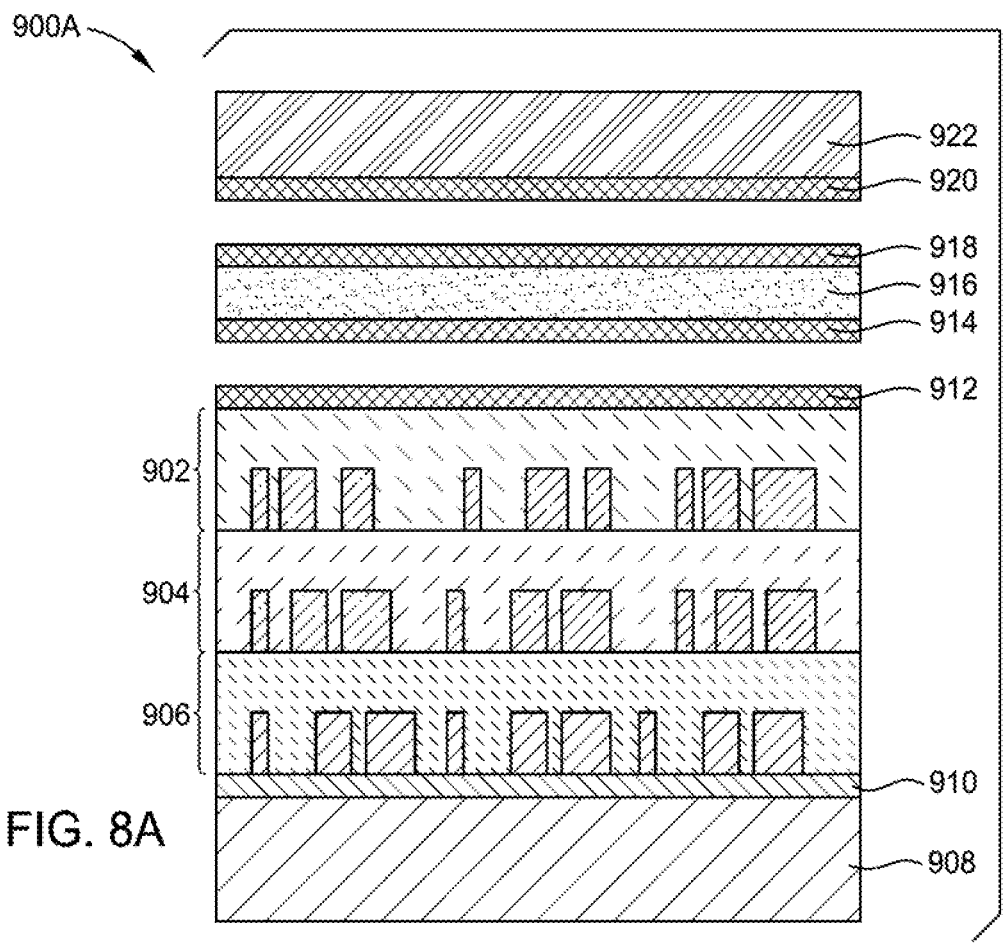
FIGS. 8A-8B are a schematic illustration of an optical element structure according to embodiments of the present disclosure.
Figure 8B:
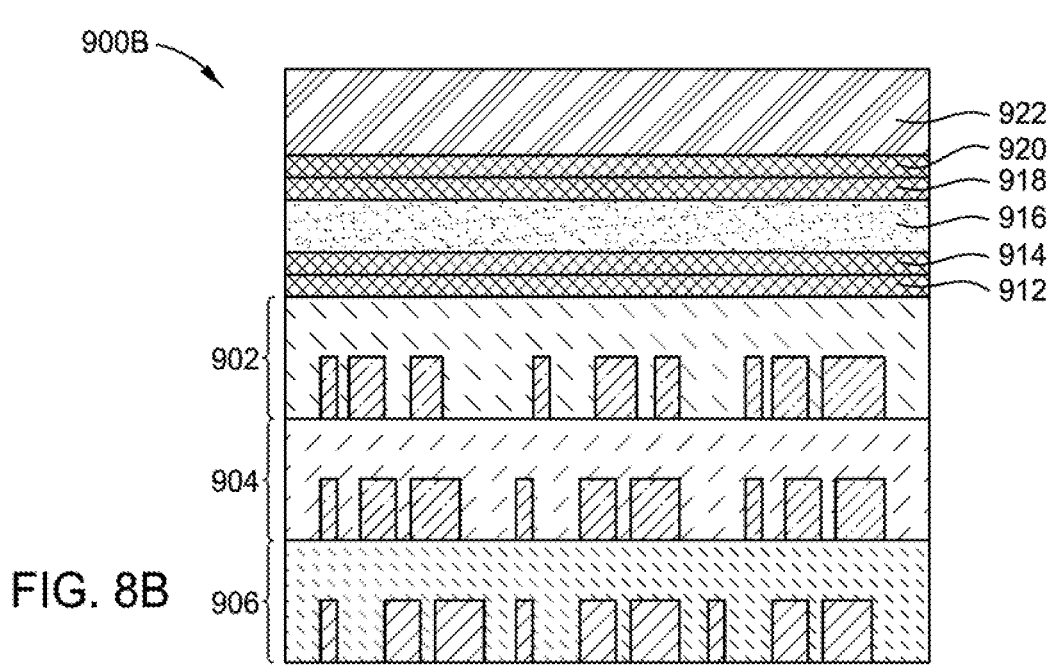

FIGS. 8A-8B show an optical element structure according to embodiments of the present disclosure. FIG. 8A shows a first optical element structure 900A prior to assembly/stacking. The first optical element structure 900A includes a first optical element layer 906 formed on a substrate 908. The first optical element layer 906 is bonded via a layer 910 which may be formed from $SiO_2$ or other material. In other examples, the layer 910 can be a de-bonding layer of high-temperature resistant adhesive. A second optical element layer 904 is bonded to the first optical element layer 906, and a third optical element layer 902 is bonded to the second optical element layer 904. A second substrate 916 may have a first bonding layer 914 and a second bonding layer 918 formed on either side. Additionally, a device 922 has a device bonding layer 920 formed thereon. The device 922 can include $SiO_2$ from a thickness of 20 nm to 10 µm.

FIG. 8B shows a second optical element structure 900B. The second optical element structure 900B includes the first optical element structure 900A from FIG. 8A. The second optical element structure 900B shows the second substrate 916 bonded to the third optical element layer 902 via a top bonding layer 912 formed on the third optical element layer 902. In the second optical element structure 900B, the layer 910 and substrate 908 have been removed, for example, by etching, grinding, polishing, or other methods. Additionally, the device 922 such as a CMOS, CCD, VCSEL, or other device 922 is bonded to the second substrate 916 via the second bonding layer 918 and a device bonding layer 920, each of which can include $SiO_2$ from a thickness of 1 nm to 100 nm. The second substrate 916 may be from 100 microns to 500 microns, and may be thinned from an original thickness, for example, from 500 microns to 100 microns, using CMP or other methods after the second substrate 916 is bonded to the second optical element structure 900B.

Figure 9:
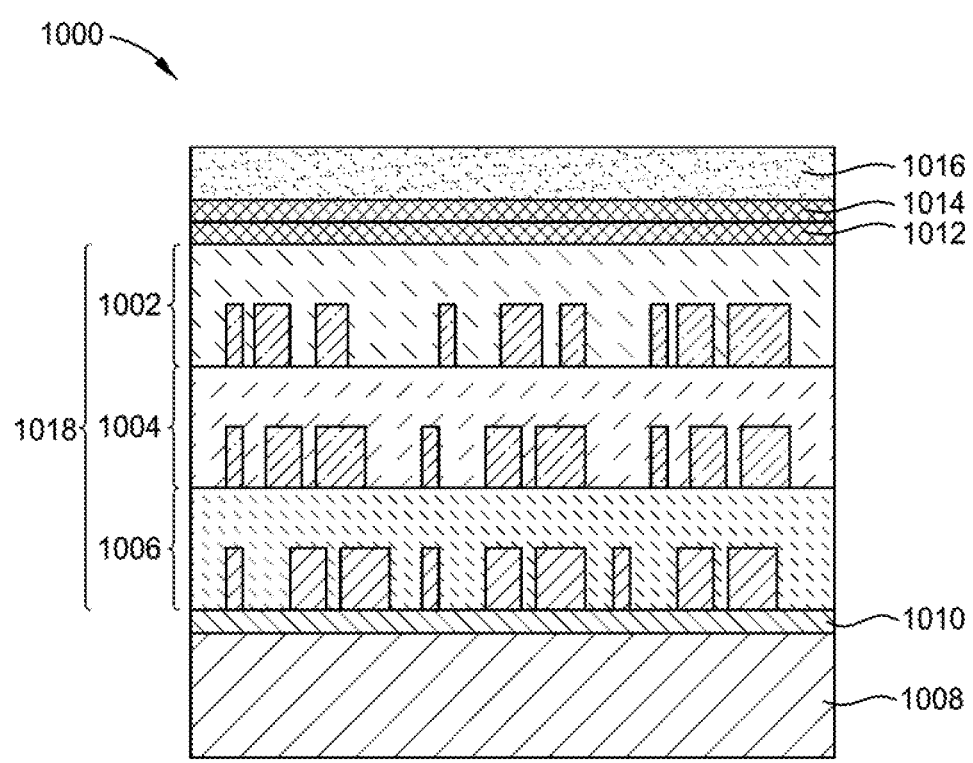
FIG. 9 is a schematic illustration an optical element structure formed on a device according to embodiments of the present disclosure.

FIG. 9 is an illustration of an optical element layer stack 1018. The optical element layer stack 1018 is bonded to a device 1016. In an example, an assembly 1000 of an optical element layer stack 1018 is bonded to a device 1016, which may be a CMOS, CCD, VCSEL, or other device. The optical element layer stack 1018 is formed on a substrate 1008 that has a layer 1010 formed in between the optical element layer stack 1018 and the substrate 1008. The layer 1010 can include a de-bonding layer or a protective layer, or combinations thereof. The optical element layer stack 1018 is made up of three optical element layers, a first optical element layer 1002, a second optical element layer 1004, and a third optical element layer 1006. In other examples, it is contemplated that the optical element device can include more or fewer optical element layers than shown. The device 1016 is bonded to the optical element layer stack 1018 via a first bonding layer 1012 formed on the first optical element layer 1002 and a second bonding layer 1014 formed on the device 1016. As discussed herein, the optical element layer stack 1018 may be formed and then bonded to the device 1016. In another example, the optical element layer stack 1018 can be pre-formed and bonded to the device 1016. In another example, the optical element layer stack 1018 can be formed in-situ on the device 1016. In some examples, not shown here, a protective layer of fill material can be formed over an outermost optical element layer, such as the first optical element layer 1002 in FIG. 9.

Figure 10:
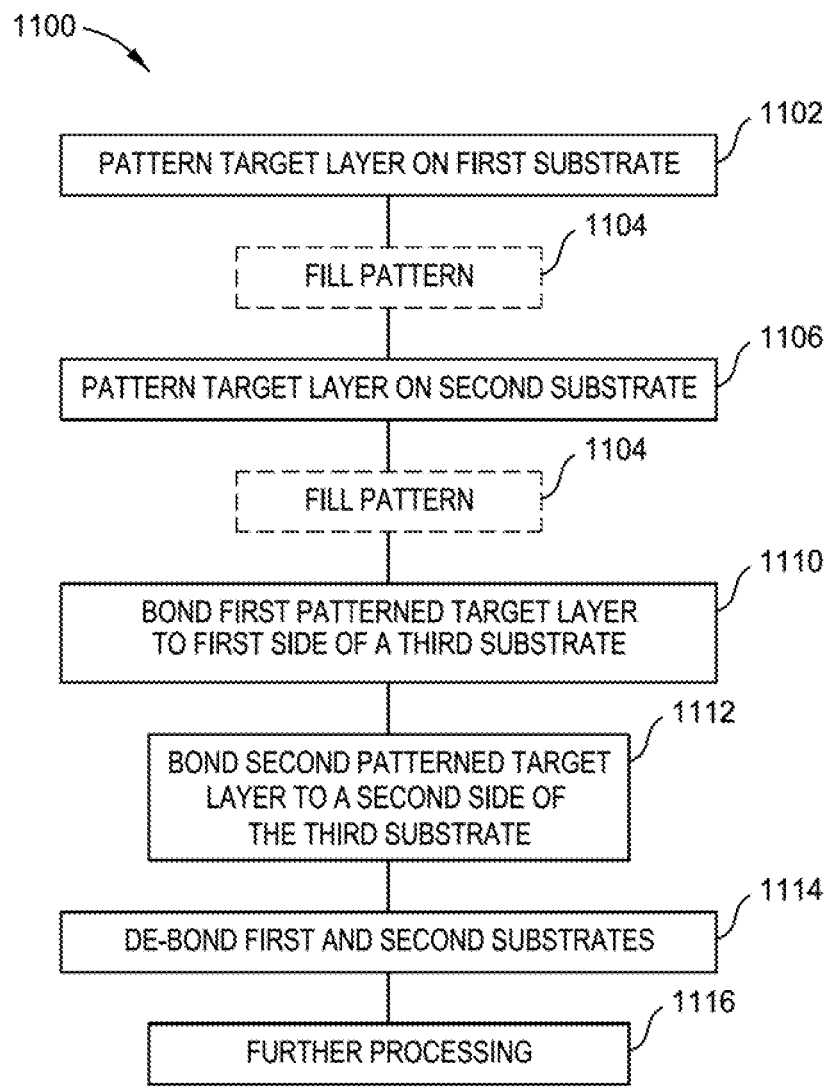
FIG. 10 is a flow chart of a method of fabricating optical elements according to embodiments of the present disclosure.

FIG. 10 is a flow chart of a method 1100 of fabricating optical elements according to embodiments of the present disclosure. FIGS. 11A-11D are cross-sectional views of optical element structures discussed in conjunction with operations of the method 1100. At operation 1102, shown at FIG. 11A, a first target layer 1202 on a first substrate 1204 is patterned to form a first pattern 1206. The first pattern 1206 includes a plurality of islands 1210. Each pair of adjacent islands of the plurality of islands 1210 is separated by a negative space that can be referred to as a trench 1208. The first pattern 1206 can be formed by optical lithography and etching, or by nanoimprint lithography (NIL) and etching, or by direct imprinting of the first target layer 1202. At operation 1104, the first pattern 1206, in particular the trenches 1208 of the first pattern 1206, can be optionally filled with a low-index material (not shown).

Figure 11A:
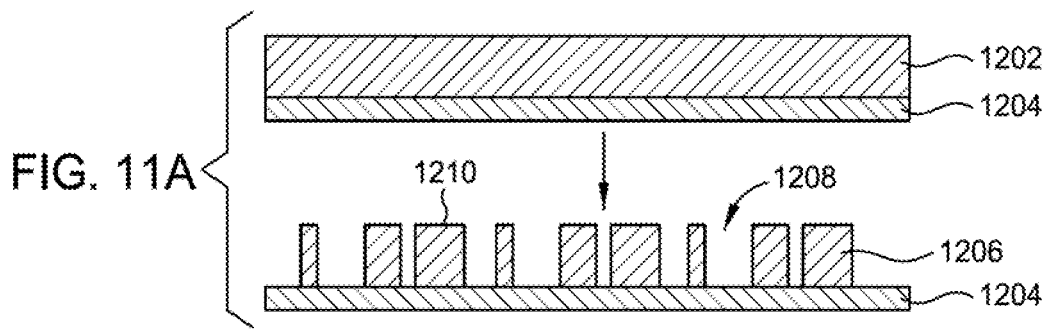
FIGS. 11A-11D are cross-sectional views of optical element structures discussed in conjunction with operations of a method of fabricating optical elements according to embodiments of the present disclosure.
Figure 11B:
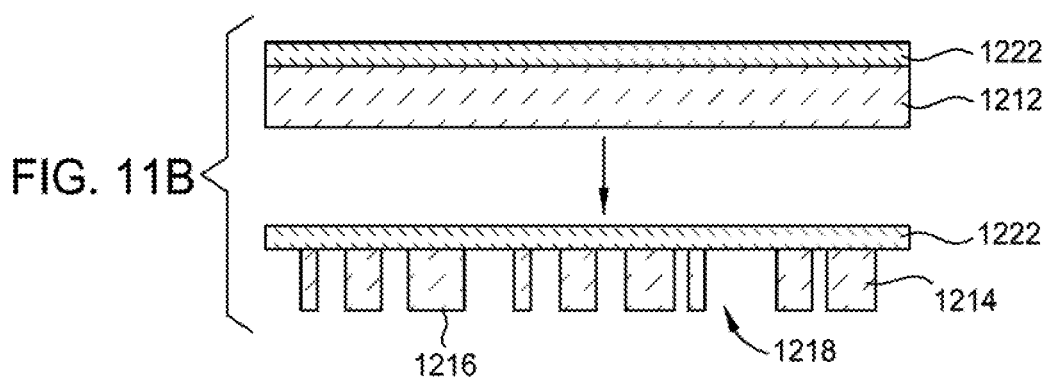

At operation 1106, shown at FIG. 11B, a second target layer 1212 formed on a second substrate 1222 is patterned to form a second pattern 1214. The second pattern 1214 includes a plurality of islands 1216, each pair of adjacent islands of the plurality of islands 1216 is separated by a trench 1218. The second pattern 1214 can be formed by optical lithography and etching, or by nanoimprint lithography (NIL) and etching, or by direct imprinting of the second target layer 1212. At operation 1108, the second pattern 1214, in particular the trenches 1218 of the second pattern 1214, can be optionally filled with a low-index material (not shown here). In some examples, neither the first pattern 1206 nor the second pattern 1214 is filled with low-index material. In some examples, the first pattern 1206 is filled with low-index material at operation 1104. In other examples, the second pattern 1214 is filled with low-index material at operation 1108. In further examples, the first pattern 1206 and the second pattern 1214 are each filled with low-index material at operations 1104 and 1108, respectively.

Figure 11C:
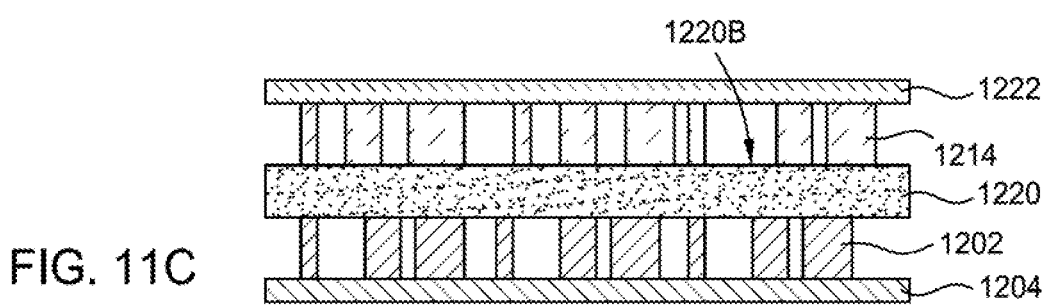

FIG. 11C is a view of an optical element structure subsequent to operations 1110 and 1112. At operation 1110, the first pattern 1206 is bonded to a first side 1220A of a third substrate 1220. The third substrate 1220 can be formed from a transparent material including glass, polymer, diamond, or other materials. Depending upon the embodiment, the third substrate 1220 can be from about 10 µm thick to 3 mm thick. At operation 1112, the second pattern 1214 is bonded to a second side 1220B of the third substrate 1220, opposite the first pattern 1206.

Figure 11D:
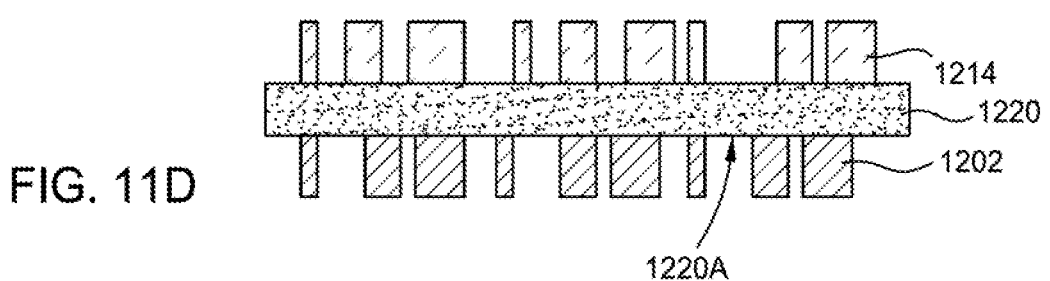

At operation 1114, the first substrate 1204 and the second substrate 1222 are removed. Thus, the first substrate 1204 and the second substrate 1222 can each be referred to as temporary substrates or carrier substrates. FIG. 11D shows an optical element structure after operation 1114. In some examples, not shown here, there can be a layer of a bonding material, referred to as a de-bonding layer, similar to the de-bonding layer 204 discussed above. The de-bonding layer can be formed in between the first target layer 1202 and the first substrate 1204, and/or between the second target layer 1212 and the second substrate 1222. The de-bonding layer can be an adhesive material or a thermally-activated material (e.g., that dissociates upon the application of heat). The de-bonding layers can be used at operation 1114 to promote the separation of the first pattern 1206 and the second pattern 1214 from the first substrate 1204 and second substrate 1222, respectively, via thermal, chemical, and/or mechanical means. At operation 1116, the optical element structure in FIG. 11D can be further processed, for example, by annealing and/or by adding (stacking) additional optical elements and transparent substrates. In one example at operation 1116, at least operations 1102, 1106, 1110, 1112, and 1114 can be repeated in an iterative fashion to form additional optical element layers.

Figure 12:
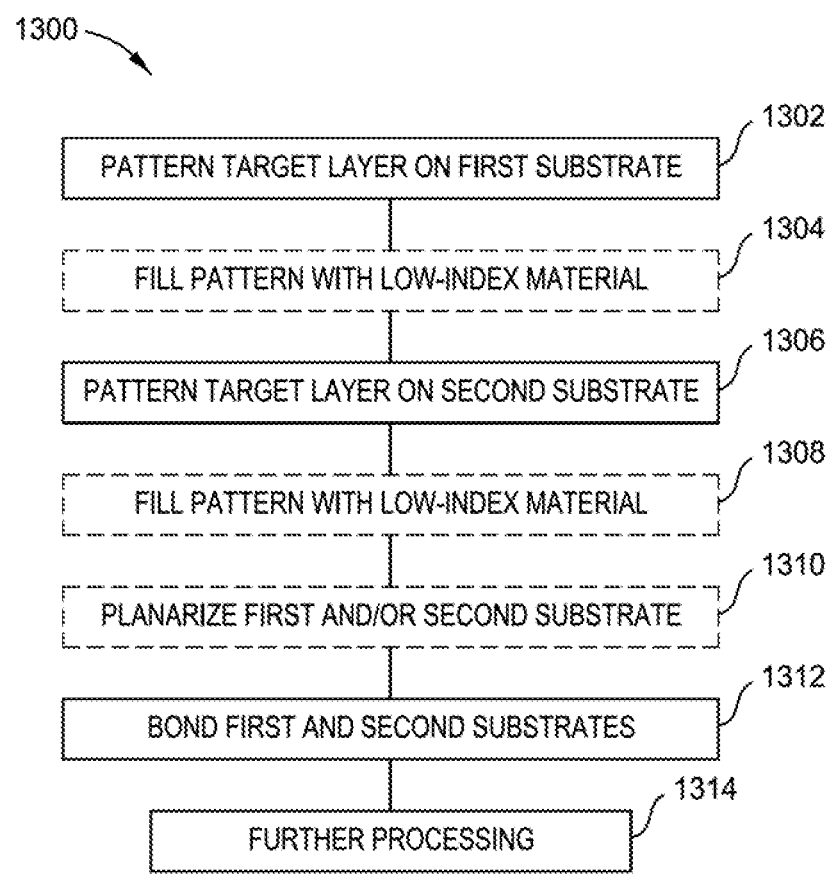
FIG. 12 is a flow chart of a method of fabricating optical elements according to embodiments of the present disclosure.
Figure 13A:
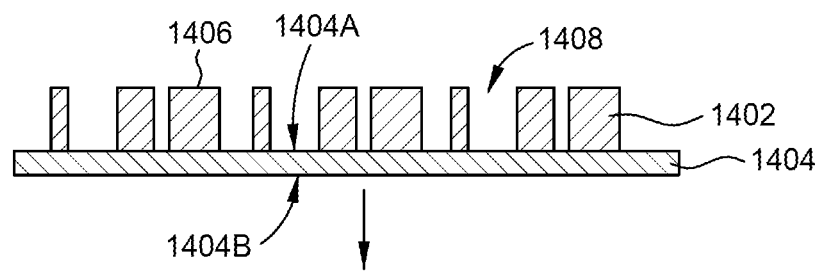
FIGS. 13A-13E are cross-sectional views of optical element structures discussed in conjunction with operations of a method of fabricating optical elements according to embodiments of the present disclosure.

FIG. 12 is a flow chart of a method 1300 of fabricating optical elements according to embodiments of the present disclosure. FIGS. 13A-13E are cross-sectional views of optical element structures and are discussed in conjunction with operations of the method 1300. At operation 1302, a first pattern 1402 is formed in a first target layer on a first surface 1404A of a first substrate 1404, as shown in FIG. 13A. The first pattern 1402 includes a plurality of trenches 1408 between the islands 1406. The first pattern 1402 can be formed at operation 1302 using optical lithography and etching, NIL and etching, or direct imprinting.

Figure 13B:
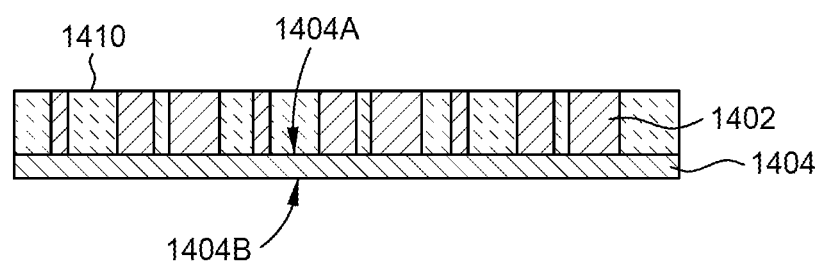
Figure 13C:
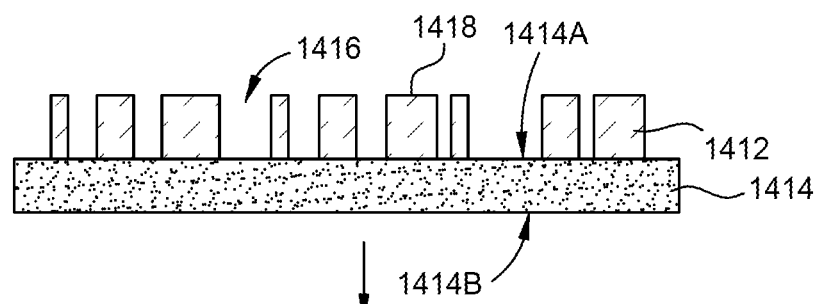

At operation 1304, the plurality of trenches 1408 of the first pattern 1402 is optionally filled with a low-index material 1410, as shown in FIG. 13B. The low-index material 1410 can be a self-planarizing material such that, subsequent to operation 1304, the top of the low-index material 1410 is co-planar with the top of the plurality of islands 1406. At operation 1306, a second pattern 1412 is formed from a second target layer formed on a first surface 1414A of a second substrate 1414. The second pattern 1412 is shown in FIG. 13C. The second pattern 1412 includes a plurality of trenches 1416. Each trench of the plurality of trenches 1416 is formed between each pair of adjacent islands 1418. The plurality of trenches 1416 and the plurality of islands 1418 can be of varying widths, heights, and cross-sectional shapes. While the plurality of islands 1418 are shown in the cross-sectional view as substantially polygon-shaped, it is contemplated that the geometries can take other shapes such as rounded, triangular, or combinations thereof, and may be tapered, angled, or bowed. The second pattern 1412 can be formed at operation 1306 using optical lithography and etching, NIL and etching, or direct imprinting.

Figure 13D:
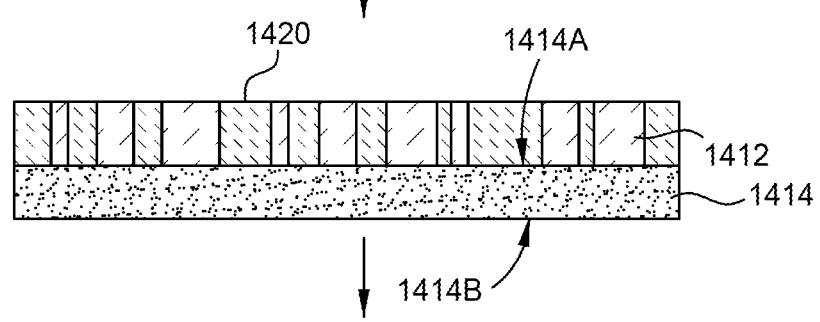
Figure 13E:
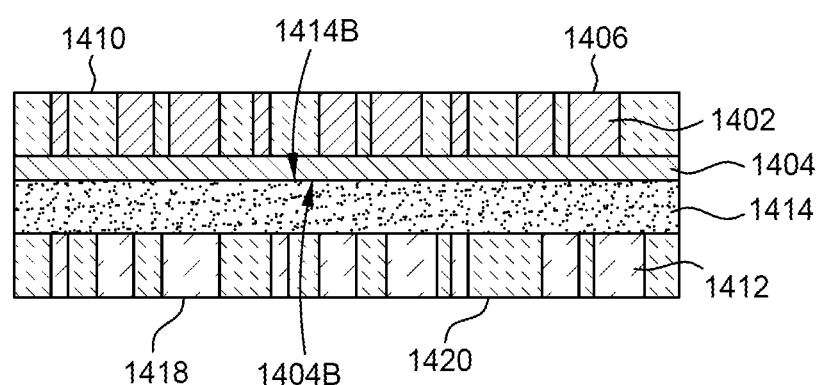

At operation 1308, the second pattern 1412 is optionally filled with a low-index material 1420, as shown in FIG. 13D. At operation 1310, one or more of the first substrate 1404 and the second substrate 1414 is planarized. In one example of operation 1310, a second side 1404B of the first substrate 1404 and a second side 1414B of the second substrate 1414 are each planarized in one or more sub-operations. Subsequently, at operation 1312, the second side 1404B of the first substrate 1404 is bonded to the second side 1414B of the second substrate 1414, as shown in FIG. 13E. Thus, the optional planarization at operation 1310 can promote the bonding of the first substrate 1404 to the second substrate 1414 at operation 1312. At operation 1314, further processing of the optical element structure can occur. The further processing at operation 1314 can include annealing, the addition of other optical element structure via stacking, dicing, or other operations.

Figure 14:
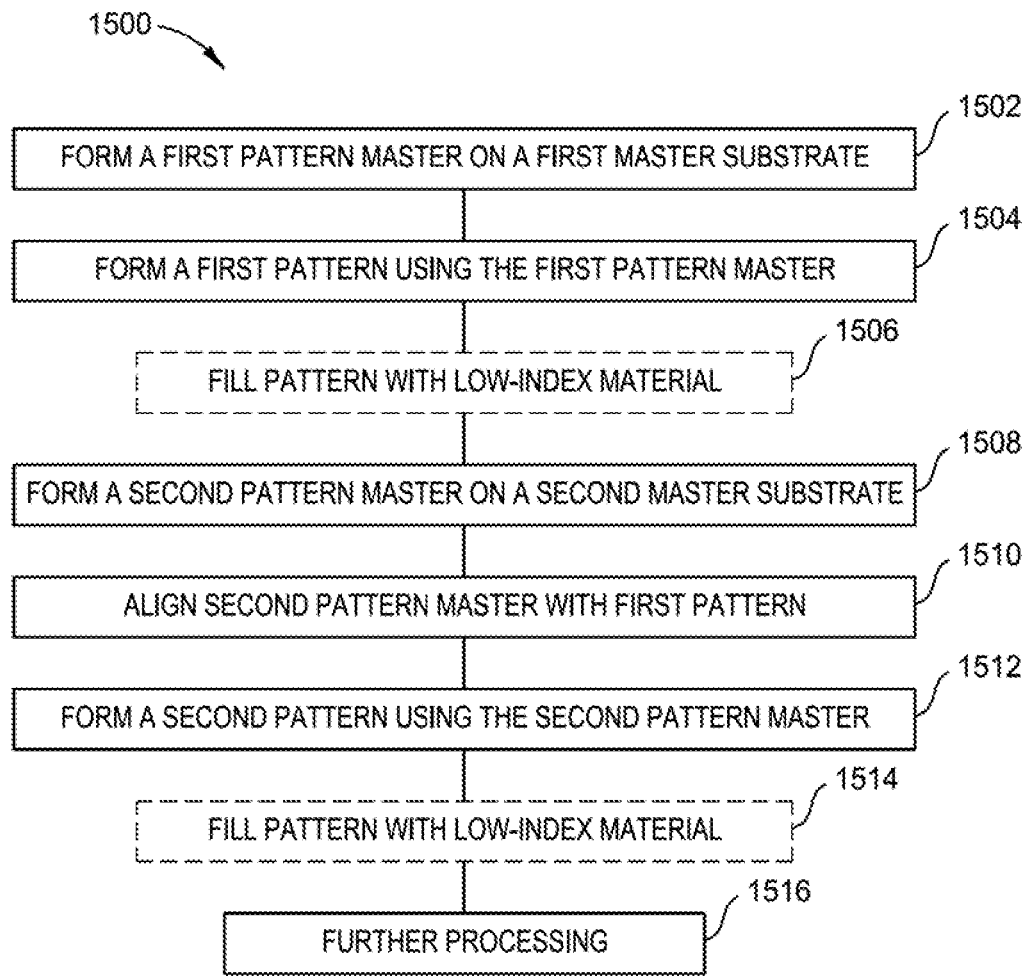
FIG. 14 is a flow chart of a method of fabricating optical elements according to embodiments of the present disclosure.
Figure 15A:
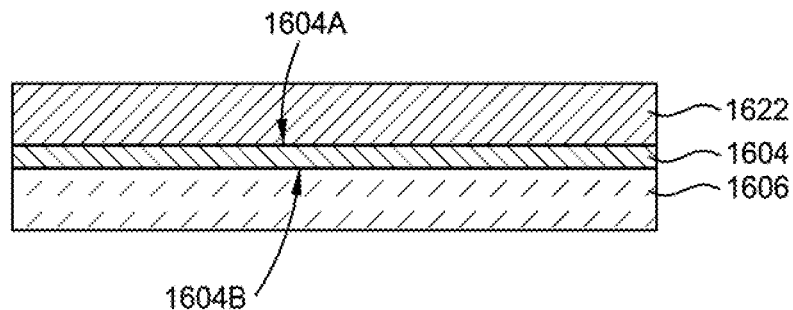
FIGS. 15A-15D are cross-sectional views of optical element structures discussed in conjunction with operations of a method of fabricating optical elements according to embodiments of the present disclosure.

FIG. 14 is a flow chart of a method 1500 of fabricating optical elements according to embodiments of the present disclosure. FIGS. 15A-15D are cross-sectional views of optical element structures that are discussed in conjunction with the method 1500. FIG. 15A is a cross-sectional view of a first transparent substrate 1604. The first transparent substrate 1604 can be formed from glass, polymer, diamond, or other optically transparent materials or combinations of optically transparent materials. A first target layer 1602 is formed on a first side 1604A of the first transparent substrate 1604. A second target layer 1606 is formed on a second side 1604B of the first transparent substrate 1604.

Figure 15B:
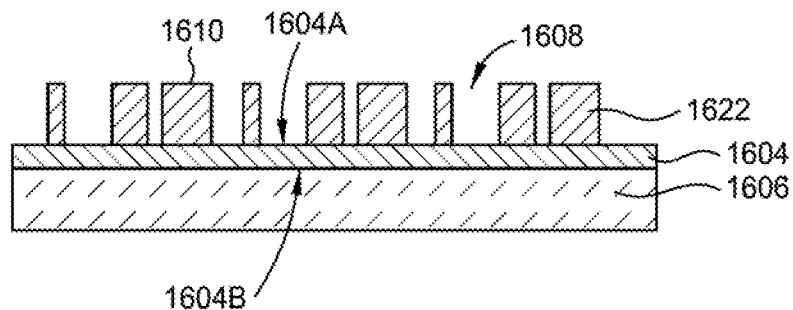
Figure 15C:
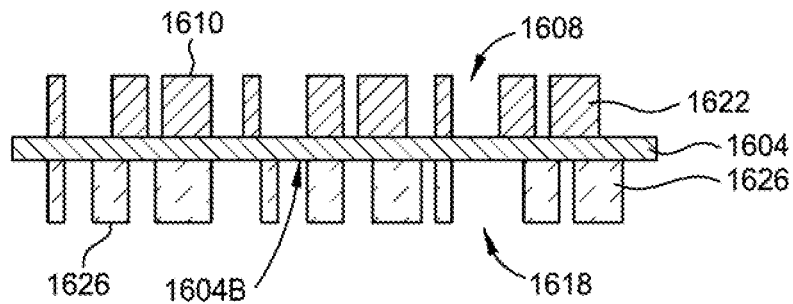

At operation 1502, a first master pattern is formed. The first master pattern can be used to imprint patterns in target layers on a substrate. The first master pattern can be formed at operation 1502 using a rigid material such as silicon or silicon-containing materials, or from less rigid materials including low or high index materials. The material used to form the first master pattern can be selected based on factors including the composition and material properties of the target layers to be imprinted at operation 1504. The first master pattern can be formed at operation 1502 by optical lithography and etching, NIL and etching, or by direct imprinting of a first master target layer. The first master pattern formed at operation 1502 is used to make a first pattern 1622 at operation 1504. The first pattern 1622 is shown in FIG. 15B. The first pattern 1622 includes a plurality of islands 1610, with islands 1610 separated by a trenches 1608. The plurality of islands 1610 extend from the first side 1604A of the first transparent substrate 1604. At operation 1506, a fill layer (not shown here) can be optionally formed in the trenches 1608. The fill layer can be formed from a low-index material.

At operation 1508, a second master pattern can be formed from a rigid material such as silicon or silicon-containing materials, or from less rigid materials including low or high index materials. The second master pattern can be used to imprint target layers on a substrate, and can include a different pattern than the first master pattern. The second master pattern can be formed from various materials depending upon the composition of the target layers that are to be imprinted at operation 1510. The second master pattern can be formed at operation 1508 by optical lithography and etching, NIL and etching, or direct imprinting of a second master target layer. At operation 1510, the second pattern master is aligned with the second target layer 1606 using the first pattern formed at operation 1506 as a reference point for alignment. At operation 1512, a second pattern 1626 is formed in the second target layer 1606. The second pattern 1626, shown in FIG. 15C, includes a plurality of islands 1616 extending from the second side 16046 of the first transparent substrate 1604. Islands 1616 are separated by the trenches 1618. At operation 1514, a fill layer can be optionally formed in the trenches 1618. The fill layer can be formed from a low-index material.

Figure 15D:
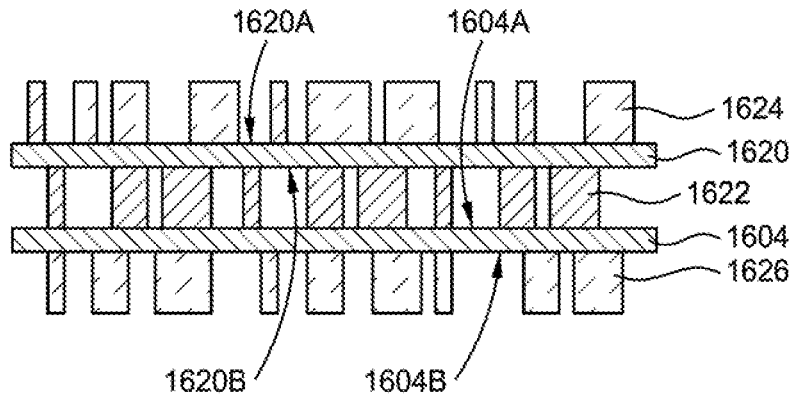

At operation 1516, the optical element structure can undergo further processing. The further processing at operation 1516 can include annealing, the addition of other optical element structures via stacking, dicing, or other operations. In one example of operation 1516, at least operations 1504, 1508, 1510, and 1512 can be repeated to form a stack of optical elements, as shown in FIG. 15D. FIG. 15D includes the first transparent substrate 1604, the first pattern 1622, and the second pattern 1626 formed at operations 1504 and 1508. FIG. 15D further includes a second transparent substrate 1620. A first side 1620A of the second transparent substrate 1620 includes a third pattern 1624. A second side 1620B of the second transparent substrate 1620 is bonded to a first side 1602A of the first pattern 1622. In some examples, the third pattern 1624 can be optionally filled, not shown in FIG. 15D. The third pattern 1624 can be formed from the first master, the second master, or from a third master that is different from the first master and the second master.

Accordingly, the examples discussed herein can, in various combinations, be used to fabricate stacked optical elements. Two or more optical elements can be fabricated via optical lithography or NIL and etching, and/or by direct imprinting using pattern masters. The optical elements can be fabricated on temporary substrates that are bonded to target layers and later removed after the patterned target layer is bonded to a permanent or carrier (second temporary) substrate. Optical element layers can be separated from each other using a fill layer that includes an interlayer. The fill layer can extend beyond the top surface of the underlying optical element layer for a distance from about 1 nm to about 3 mm that forms the interlayer portion of the fill layer. In other examples, the optical elements can be fabricated on a permanent substrate that is a transparent substrate of varying thicknesses up to about 3 mm.

Although various embodiments which incorporate the teachings of the present invention have been shown and described in detail herein, those skilled in the art can readily devise many other varied embodiments that still incorporate these teachings.

What is claimed:

1. A method for forming an optical device, comprising:
   disposing a de-bonding layer on a substrate;
   disposing a first target layer on the de-bonding layer;
   patterning the first target layer to form a first pattern of a plurality of first trenches, each first trench of the plurality of first trenches defined by adjacent first islands of a plurality of first islands, the patterning the first target layer including a first process comprising one of nano-imprint lithography (NIL), dry etching, or wet etching;
   depositing a first fill layer in the plurality of first trenches and over the plurality of first islands;
   removing a residual material of the first fill layer such that a top surface of the first fill layer is coplanar with a top surface of each of the plurality of first islands;
   disposing a second fill layer over the first fill layer and the plurality of first islands after the step of removing the residual material of the first fill layer, wherein the second fill layer, the plurality of first islands, and the first fill layer in the plurality of first trenches form a first optical element layer;
   disposing a second target layer over the first optical element layer;
   patterning the second target layer to form a second pattern of a plurality of second trenches, each second trench of the plurality of second trenches defined by adjacent second islands of a plurality of second islands, the patterning the second target layer including a second process comprising one of NIL, dry etching, or wet etching;
   depositing a third fill layer in the plurality of second trenches and over the plurality of second islands; and
   removing a residual material of the third fill layer such that a top surface of the second third fill layer is coplanar with a top surface of each of the plurality of second islands.

2. The method of claim 1, wherein a selection of the second process is different than that of the first process.

3. The method of claim 1, further comprising:
   removing the first fill layer to achieve a pre-determined flatness.

4. The method of claim 3, wherein the substrate comprises one of a charge-coupled devices (CCD), a complementary metal-oxide semiconductor (CMOS), a vertical-cavity surface-emitting laser (VCSEL), light-emitting diode (LED), an organic light-emitting diode (OLED), and a micro LED (uLED) component.

5. The method of claim 1, wherein the first pattern of the plurality of first islands of the first optical element layer is different than the second pattern of the plurality of second islands of the second optical element layer.

6. The method of claim 1, wherein the first target layer and the second target layer are different materials.

7. The method of claim 1, wherein the plurality of first islands and the plurality of second islands have different heights.

8. A method for fabricating optical devices, comprising:
   providing a substrate;
   forming a de-bonding layer on the substrate;
   forming a first target layer on the de-bonding layer and forming a first pattern on the first target layer by one of NIL, dry etching, or wet etching;
   forming a first fill layer over the first pattern;
   forming a second fill layer over the first fill layer; and
   forming a second target layer over the second fill layer and forming a second pattern on the second target layer in a manner that is different from that used to form the first pattern on the first target layer such that the forming of the second pattern by one of NIL, dry etching, or wet etching is different from the forming of the first pattern.

9. The method of claim 8, wherein the substrate comprises one of a charge-coupled devices (CCD), a complementary metal-oxide semiconductor (CMOS), a vertical-cavity surface-emitting laser (VCSEL), light-emitting diode (LED), an organic light-emitting diode (OLED), and a micro-LED (uLED) component.

10. The method of claim 8, further comprising forming a third layer over the second layer and forming a third pattern on the third layer in a manner that is different from that used to form one of the first pattern and the second pattern such that the forming of the third pattern by one of NIL, dry etching, or wet etching is different from the forming of the first pattern or the forming of the second pattern.

* * * * *